(12) United States Patent
Lopatinsky et al.

(10) Patent No.: US 6,664,673 B2
(45) Date of Patent: Dec. 16, 2003

(54) COOLER FOR ELECTRONIC DEVICES

(75) Inventors: Edward L. Lopatinsky, San Diego, CA (US); Lev A. Fedoseyev, El Cajon, CA (US); Dan K. Shaefer, Palm Desert, CA (US); Saveliy T. Rosenfeld, San Diego, CA (US); Yuri I. Fedosov, St. Petersburg (RU); Viktor N. Popov, St. Petersburg (RU); Nil N. Askhatov, La Mesa, CA (US)

(73) Assignee: Advanced Rotary Systems LLC, San Diego, CA (US)

( * ) Notice: Subject to any disclaimer, the term of this patent is extended or adjusted under 35 U.S.C. 154(b) by 67 days.

(21) Appl. No.: 09/940,304

(22) Filed: Aug. 27, 2001

(65) Prior Publication Data

US 2003/0048013 A1 Mar. 13, 2003

(51) Int. Cl.$^7$ ................................................. H02K 7/20
(52) U.S. Cl. ...................... 310/63; 310/58; 310/60 R; 310/64; 310/268; 361/697
(58) Field of Search ................................. 310/266, 268, 310/58, 60 R, 61, 62, 63, 64; 361/694–697; 257/712–713, 721–722; 165/80.2–80.4

(56) References Cited

U.S. PATENT DOCUMENTS

| | | | | |
|---|---|---|---|---|
| 4,164,690 A | * | 8/1979 | Muller et al. | 318/254 |
| 4,504,751 A | * | 3/1985 | Meier | 310/62 |
| 5,379,999 A | * | 1/1995 | Barzideh et al. | 271/264 |
| 5,629,560 A | * | 5/1997 | Katsui et al. | 257/712 |
| 5,661,638 A | | 8/1997 | Mira | 361/697 |
| 5,838,066 A | | 11/1998 | Kitajo | 257/712 |
| 5,867,365 A | | 2/1999 | Chiou | 361/690 |
| 6,157,104 A | * | 12/2000 | Yokozawa et al. | 310/58 |

FOREIGN PATENT DOCUMENTS

| | | |
|---|---|---|
| JP | 8-195456 A | 7/1996 |
| WO | WO 01/43519 A | 6/2001 |

* cited by examiner

*Primary Examiner*—Burton Mullins
(74) *Attorney, Agent, or Firm*—Frishauf, Holtz, Goodman & Chick, P.C.

(57) ABSTRACT

According to the present invention, a cooler for electronic devices comprises a heat exchange element, a blower with a radial type impeller, and an electric drive. The heat exchange element comprises heat exchanging means made on one surface of said heat exchange element while its other surface provides thermal contact with a heat-radiating means. The radial type impeller has a shroud with a flat surface from one side, a hub and brackets and a central inlet between the shroud and the hub, the brackets connect the hub with the shroud. The radial type impeller is positioned on the heat exchange element so that the heat exchanging means being surrounded by the radial type impeller and a cooling gas flows to the radial type impeller from the central inlet through the heat exchanging means. The electric drive comprises a magnetic rotor and a stator; the magnetic rotor is a flat disk—type rotor comprises a central hole inside the disk and circumferential arrayed like poles, the stator comprises circumferential arrayed coils, axis of said coils are parallel to the axis of rotation, the coils mounted around of the circumferential arrayed like poles. The magnetic rotor is placed on the shroud of the radial type impeller and connect with the shroud, the shaft of the electric drive is located inside the hub of the radial type impeller, and the central hole of the flat disk—type rotor is substantially coincided with the central inlet.

33 Claims, 20 Drawing Sheets

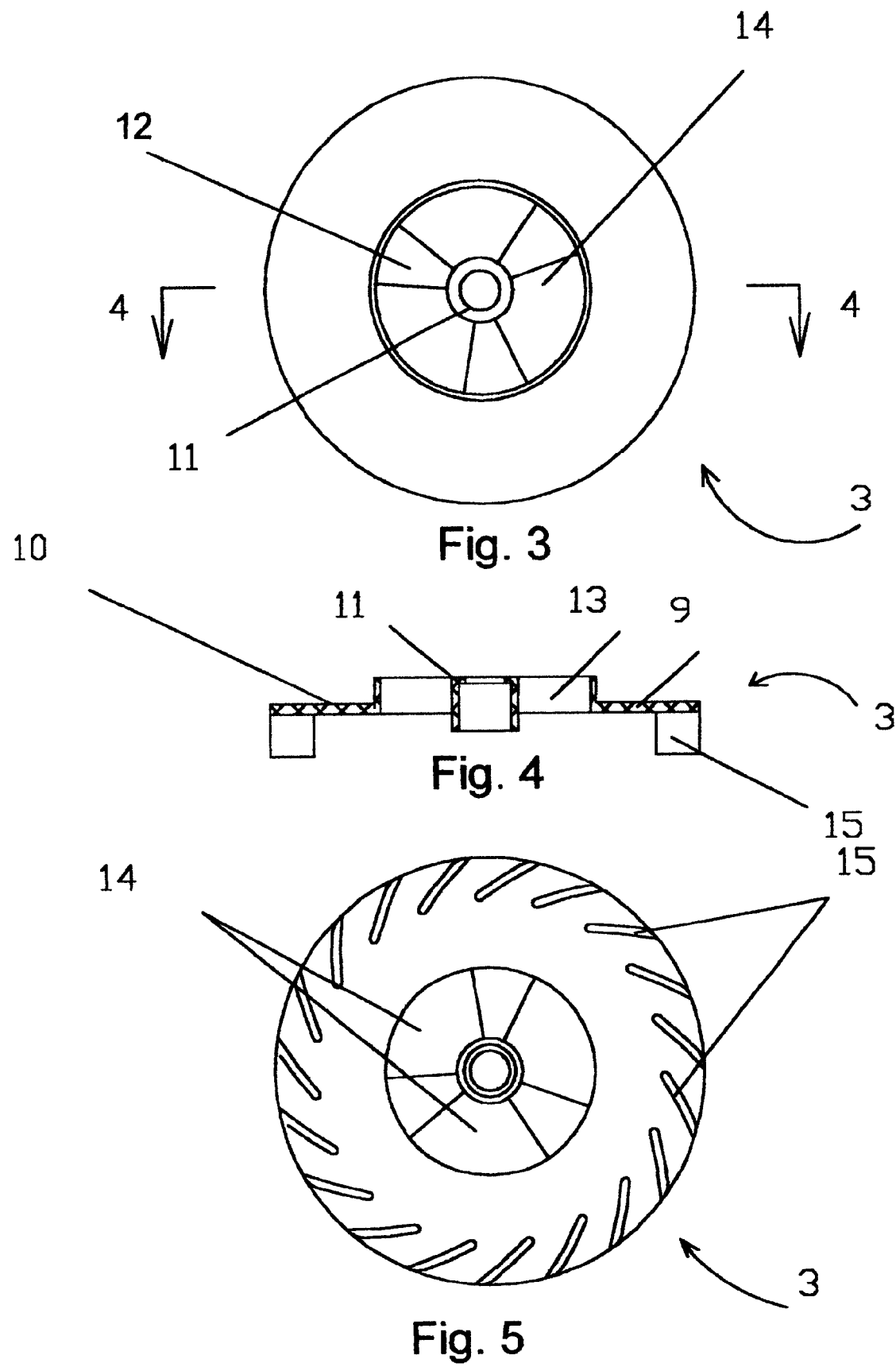

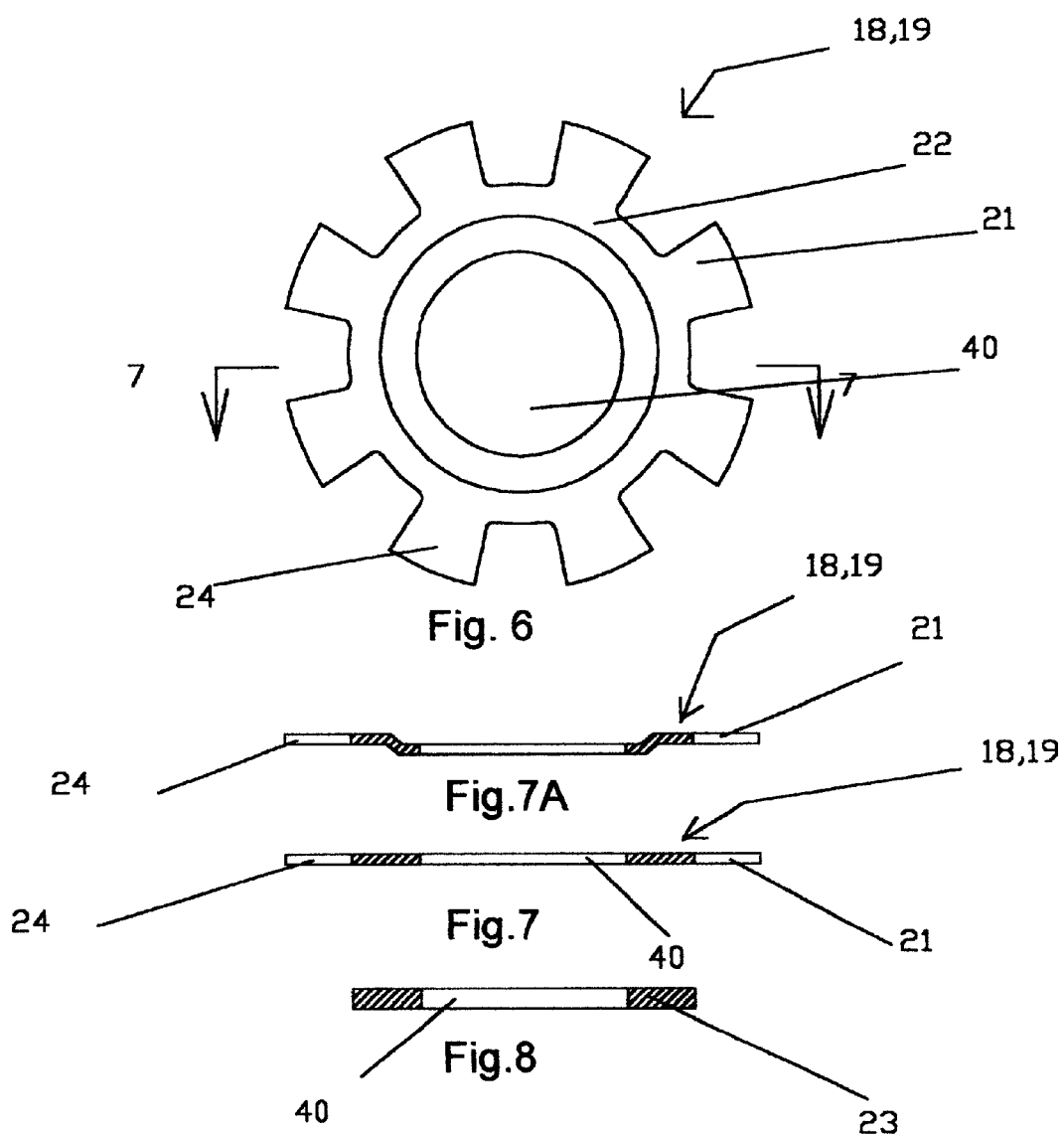

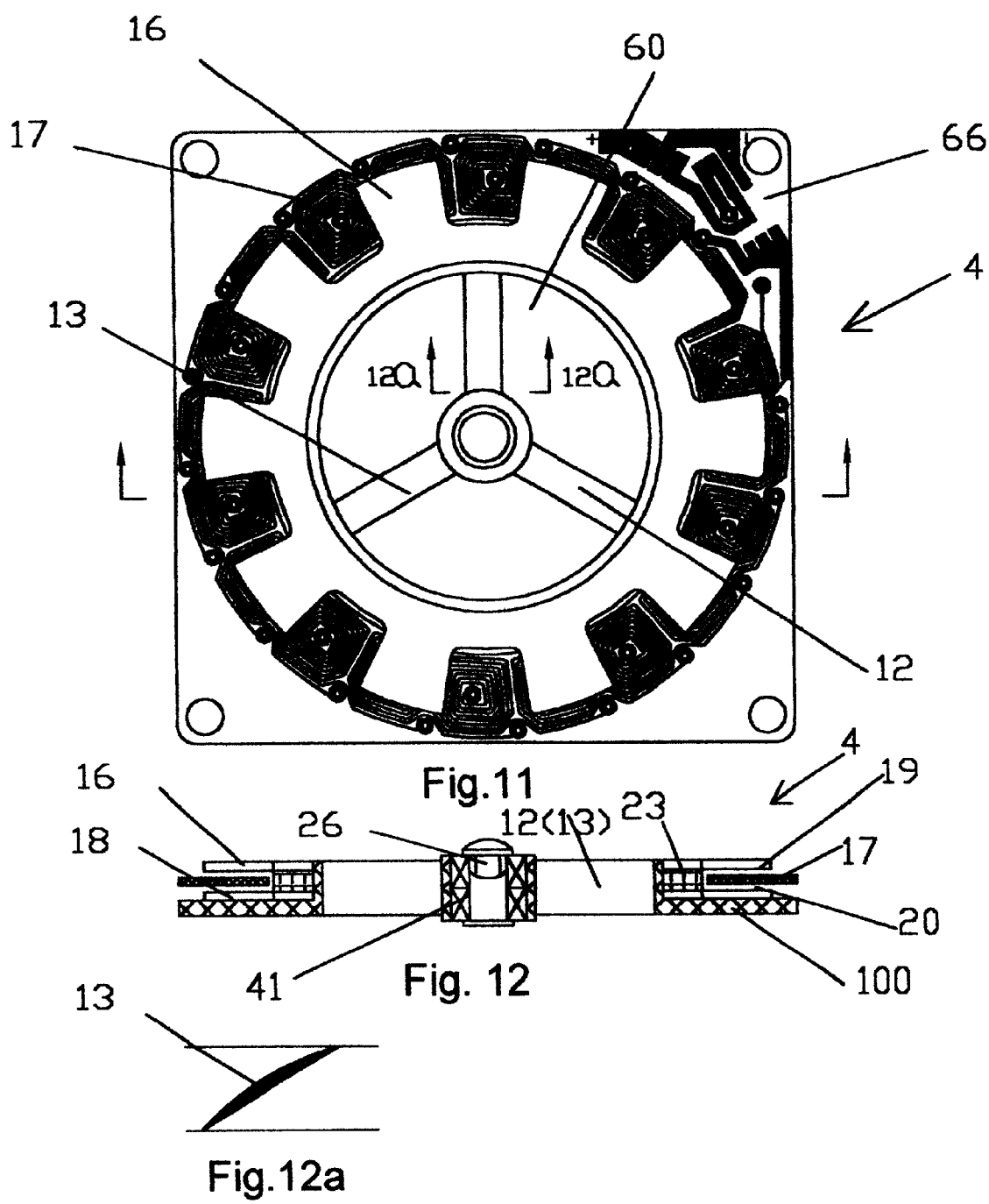

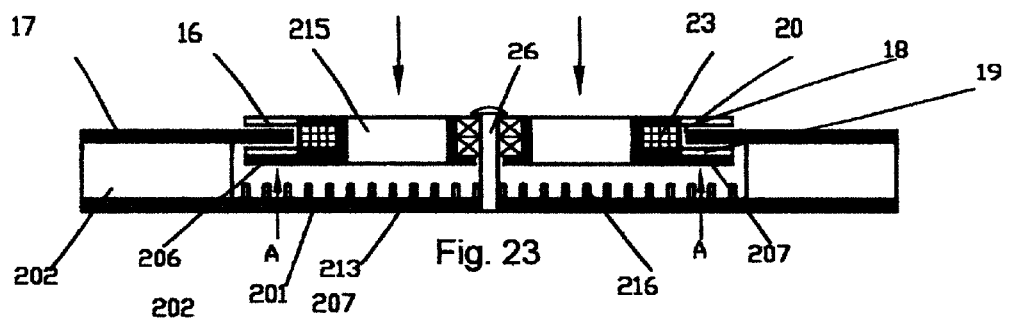
Fig. 23
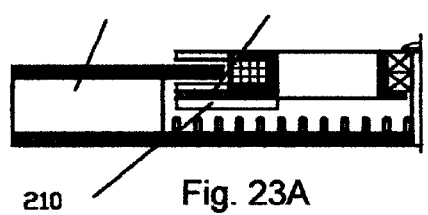
Fig. 23A
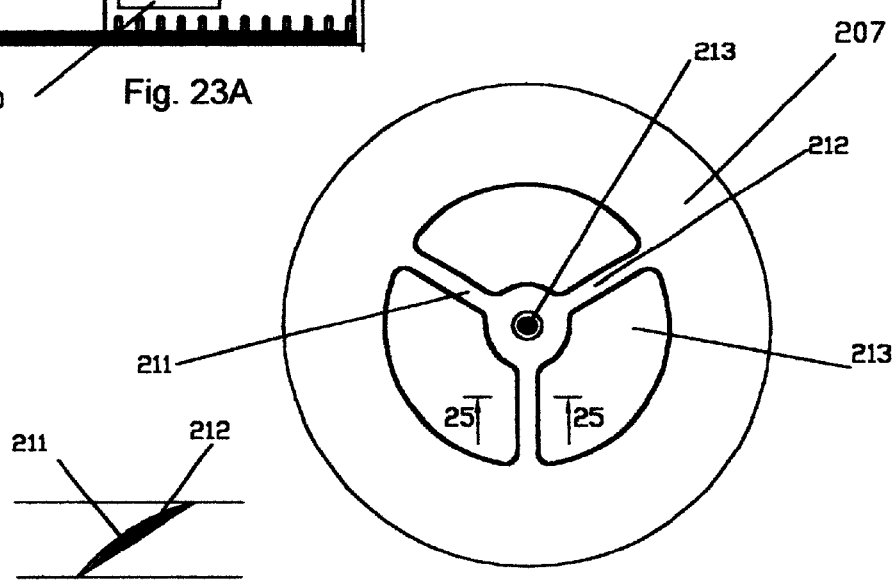
Fig. 25
Fig. 24

COOLER FOR ELECTRONIC DEVICES

FIELD OF THE INVENTION

The present invention relates generally to cooling devices and, more particularly, to cooling devices for removing heat from electronic devices by a flow of gas, in particular, airflow, said flow being produced by a blower.

BACKGROUND OF THE INVENTION

During normal operation, most electronic devices generate significant amounts of heat. If this heat is not continuously removed, the electronic device may overheat, resulting in damage to the device and/or a reduction in operating performance.

In order to avoid such problems caused by overheating, cooling devices are often used in conjunction with electronic devices.

One such cooling device used in conjunction with electronic devices is a fan assisted heat sink. In such device, a heat sink is formed from a material, such as aluminum, which readily conducts heat. The heat sink is usually placed on top of, and in physical contact with, the electronic device.

One method of increasing the cooling capacity of these heat sinks is by including a plurality of cooling fins that are physically connected to the heat sink. These fins serve to increase the surface area of the heat sink and, thus, maximize the transfer of heat from the heat sink to the ambient air. In this manner, the heat sink draws heat away from the electronic device and transfers the heat to the ambient air.

In order to further enhance the cooling capacity of a heat sink device, an electrically powered blower (an axial fan may serve as the blower) is often mounted within or on top of the heat sink. In operation, the fan forces air to pass over the fins of the heat sink, thus, cooling the fins by enhancing the heat transfer from the fins into the ambient air. As the fins are cooled, heat can be drawn from the electronic device and into the heat sink at a faster rate. The fan typically draws air into the heat sink from the top of the heat sink, passes the air over the fins, and exhausts the air from the heat sink in the vicinity of the bottom (side) of the heat sink. Accordingly, the exhaust air is hotter than the intake air.

There are known devices of this type—see, for example, U.S. Pat. No. 5,867,365 "CPU heat sink assembly" and U.S. Pat. No. 5,661,638 "High performance spiral heat sink".

The design of the device described in U.S. Pat. No. 5,867,365 comprises an axial fan that produces a flow passing by heat exchanging channels of the heat sink. The majority of inlets to heat exchanging channels are located just opposite the axial fan's impeller with a certain number of said channels being placed radially in relation to fan axle.

U.S. Pat. No. 5,661,638 also involves the application of an axial fan. Specific embodiment of device claimed in said patent involves such placement of heat exchanging channels of the heat sink that they are located centrally-symmetrically about the fan axle. To increase the heat exchange area, the heat exchanging channels are made of spiral-like shape and bent backwards in the direction of blower rotation. In this case the fan is installed in a recess made in the heat sink body.

In the above-mentioned designs, the axial fan produces sufficient air pressure. However, due to the weak airflow in the area adjacent to the fan axle, the conditions for cooling the central part of the heat sink, located underneath the fan, are unfavorable. In this case uniform cooling of the heat sink and electronic device, such as a processor, will not take place. The energy of airflow outgoing from fan impeller, in the axial direction, is expended on deceleration and change in flow direction before entering to the heat exchanging channels. This decreased airflow velocity, passing by the heat exchanging channels doesn't allow good conditions for the heat exchange process.

Centrifugal blowers are rarely used in cooling device designs for the purpose of producing airflow.

Specifically, U.S. Pat. No. 5,838,066 "Miniaturized cooling fan type heat sink for semiconductor device" offers a design employing a centrifugal blower that is installed to the side of the heat sink. In one particular embodiment of this invention the cooling airflow passes by rectilinear heat exchanging channels of the heat sink.

However, placement of the centrifugal blower to the side of the heat sink increases the device size. The location of the centrifugal blower leads to poor coordination between the airflow produced by the blower and the direction of the inlet channels of the heat sink. The loss in airflow energy results in the reduction of airflow speed in the heat exchanging channels and in the decline of heat exchange efficiency. A portion of energy, of the airflow, is also expended in the form of friction against the casing enclosing the blower.

An invention described in the patent of Japan No. 8-195456 entitled "Cooler for electronic apparatus". This device comprises a centrifugal fan enclosed in the casing and installed above the heat exchanging channels that are made divergent. Another heat sink surface is made so that the possibility of thermal contact with an electronic device is provided for. The inlet of the centrifugal fan faces the heat sink. The fan produces an airflow that passes by heat exchanging channels and then gets drawn into the inlet of the centrifugal fan. Since the centrifugal fan operates by drawing air in to the heat sink, there is an area in the central part of the heat sink that that receives poor airflow movement. This can be seen in the published patent. Therefore, cooling of the heat sink's central part, which is the hottest, is ineffectively performed and results in uneven cooling of the heat sink. To avoid uneven cooling of the heat sink, one has to raise the fan power in order to increase the airflow. In addition, the device is of considerable height because of the centrifugal fans placement above the heat sink, and the electric drives placement above the centrifugal fan.

Increasing the size of the cooling device in a vertical direction (i.e. in a direction transverse to the orientation of the integrated circuit device) is often a problem because of the limited envelope available in many applications, such as in the computer case of a desktop computer and especially for portable electronic devices such us laptop computers. This is an even greater problem because, in most situations, a fairly substantial clearance area is required between the fan opening and the computer case to allow adequate airflow into or out of the fan.

Thus, it would be generally desirable to provide an apparatus, which overcomes these problems associated with fan assisted heat sink devices.

SUMMARY OF THE INVENTION

Accordingly, it is an object of the present invention to provide a cooler that achieves more uniform cooling of electronic devices by more effective cooling of the central part of the heat exchange element.

It is another object of the present invention to provide a cooler with an overall reduction in height and in doing so allow for a reduction of the cooling device size.

It is further an object of the present invention to provide an electric motor combined with a heatsink that has a significant reduction in overall height.

In order to achieve these objectives the following described cooler design is needed. According to the present invention, a cooler for electronic devices comprises a heat exchange element, a blower with a radial type impeller, and an electric drive, wherein said heat exchange element comprises heat exchanging means made on one surface of said heat exchange element while its other surface provides thermal contact with a heat-radiating means, said radial type impeller has a shroud with a flat surface from one side, a hub and brackets and a central inlet between the shroud and the hub, said brackets connect the hub with the shroud, said radial type impeller is positioned on the heat exchange element so that the heat exchanging means being surrounded by the radial type impeller and a cooling gas flows to the radial type impeller from the central inlet through the heat exchanging means, said electric drive comprises a magnetic rotor and a stator; said magnetic rotor is a flat disk—type rotor comprises a central hole inside the disk and circumferential arrayed like poles, said stator comprises circumferential arrayed coils, axis of said coils are parallel to the axis of rotation, said coils mounted around of the circumferential arrayed like poles. Said magnetic rotor is placed on the shroud of the radial type impeller and connected with the shroud, the shaft of the electric drive is located inside the hub of the radial type impeller, and the central hole of the flat disk type rotor coincides with the central inlet.

Further said magnetic rotor comprises at least two magnetized rings each having circumferential arrayed like poles and being mounted perpendicularly to the axis of rotation, and said circumferential arrayed like poles of one of the magnetized ring being magnetized in opposite polarity and coincide to the circumferential arrayed like poles of another magnetized ring in a projection at a plane normal to the axis of rotation, said at least two flat rings installed with a gap between said flat rings in a place, where the magnetic rotor interacts with the stator and with a contact between said flat ring axially beyond the gap, said coils of said stator at least partially mounted at the gap between the circumferential arrayed like poles of one of the magnetized ring and the like circumferential arrayed poles of the another adjacent magnetized ring. A cylindrical magnet that is magnetized in the axial direction may be placed coaxially to the shaft between said magnetized disks. The heat exchanging means are pins and fins, and the heat-exchange element is made from a high heat-conducting material. The heat-radiating means may be a heat-pipe.

One of the flat rings of the magnetic rotor is placed flush-mounted with the flat surface of one side of the shroud of the radial type impeller.

Flat rings are magnetized in a such way that the poles of each flat rings are like poles, while in relation to the poles of the other flat ring they are unlike poles, the magnetic rotor poles are made up by teeth on the outer circumferences of said flat rings, said teeth coincide along the direction of said rotation axis.

The stator poles are placed in the space between the said magnetic rotor poles of each disk.

In addition, the cooler for electronic devices may comprise the heat exchange element that has heat exchanging fins and/or pins and heat exchanging channels.

Said heat exchanging fins and/or pins are surrounded by the radial type impeller, said radial type impeller is surrounded by said heat exchanging channels and a cooling gas flows from the central inlet through the heat exchanging fins and/or pins, the radial type impeller and the heat exchanging channels in a series way.

The heat exchanging channels may be formed by rows of profiled elements; said profiled elements may be made in the form of pins and/or fins. The heat exchanging channels may be made spiral-like and bent in the direction of blower rotation, and inlets of the heat exchanging channels are oriented in the direction of propagation of an output of the cooling gas flow produced by the radial type impeller. The heat exchanging channels may be made of constant width.

The stator may be made like a printed circuit board, said printed circuit board covers the heat exchanging channels from the opposite side of the surface, which provides thermal contact with the heat-radiating means.

Next, the electric drive for cooler for electronic device comprises a stator, a magnetic rotor and a motor controller. Said magnetic rotor comprises at least two magnetized rings having circumferential arrayed like poles and are mounted perpendicularly to the axis of rotation, and said circumferential arrayed like poles of one of the magnetized ring are magnetized in opposite polarity and coincide to the circumferential arrayed like poles of another magnetized ring in a projection at a plane normal to the axis of rotation. Said at least two flat rings installed with a gap between said flat rings in a place, where the magnetic rotor interact with the stator and with a contact between said flat ring axially beyond the gap. Said stator comprises circumferential arrayed coils, axis of said coils are parallel to the axis of rotation, said coils at least partially mounted at the gap between the circumferential arrayed like poles of one of the magnetized ring and the like circumferential arrayed poles of the another adjacent magnetized ring.

One of the flat rings of said magnetic rotor is placed on an additional flat ring made from nonmagnetic material and said additional flat ring being connected by brackets with a shaft of the electric drive. The brackets may be made in the form of axial blower blades. One of the flat rings of the magnetic rotor is placed flush-mounted with the flat surface of one side of the shroud of the radial type impeller. The flat rings are magnetized in a such way that the poles of each flat rings are like poles, while in relation to the poles of another flat rings they are unlike poles, the magnetic rotor poles are made up by teeth on the outer circumferences of said flat rings. A cylindrical magnet, which is magnetized in the axial direction, is placed between the flat rings. The stator may be made like a printed circuit board.

To prevent additional noise caused by the pulsation of pressure of the cooling flow at the inlets of the heat exchanging channels, it is advisable to install the centrifugal blower impeller with a radial gap of no less than 0.03d (where d is the diameter of centrifugal blower impeller) in relation to the inlets of the heat exchanging channels.

The heat exchanging channels covered with the stator plate from above. In this case the cooling airflow will propagate only along the channels.

A disk-type centrifugal blower with at least one disk is used in the design. The disks are installed in such manner that the edge of disk surface facing the heat exchange element is located opposite the inlets to the heat exchanging channels.

The centrifugal blower supplies cooling flow (for instance, airflow) to the central part of the heat exchange element, which fact facilitates the effective cooling of the hottest part of the heat exchange element. Transfer of energy from blower disk to the airflow proceeds due to the friction forces.

The airflow movement in the central part of the heat exchange element is not only in the radial direction, but also in the tangential direction. This allows for an additional increase in airflow velocity in the central part of the heat sink to take place resulting in a gain in cooling efficiency.

Since the edges of blower disk surfaces facing the heat exchange element are located opposite the inlets to the heat exchanging channel, the cooling flow is supplied to said inlets and as the airflow passes by the channels it cools the heat exchange element down. The disk-type centrifugal blower generates a radial airflow that matches the inlets to the heat exchanging channels.

The disk-type centrifugal blower is characterized by its small size (in terms of height) while being effective enough to perform as a cooling fan. It is also characterized by having low noise levels as compared to other types of centrifugal blowers with all other factors being equal.

The above-mentioned specific features of the device claimed herein provide for a special cooling pattern, which is characterized by the fact that the hottest part of the heat exchange element (namely, its central part) gets cooled first, and, as compared to the above-described prototype, the entire cooling process proceeds more evenly and without losses that are caused in said prototype by flow turn and friction when the cooling flow (going from the blower disk) enters the heat exchanging channels. As a consequence, when using the invention being claimed one would need a blower of lesser power and size.

In addition, the surface of at least one of the disks of the disk-type centrifugal blower (facing the heat exchange element) may be equipped with radial projection that increase the radial component of the airflow.

Axial blower blades may be installed on at least one of the disks of the centrifugal blower near its central opening; said blades being attached to the disk. The blades may be installed on one disk or on several disks. Installation of the axial blower blades near the central opening of the disk increases the pressure of cooling airflow in the central part of the heat exchange element with the blower capacity being the same. Such a design of the disk-type centrifugal blower coupled with installation of the axial blower blades makes it possible to attain the same blower capacity with a lower number of revolutions, which fact results in additional decrease in noise level generated by the blower.

According to one embodiment, the axial blower blades may be used as straps that secure disk on the axle of the centrifugal blower.

For the purpose of increasing the heat exchange area, the heat exchanging channels can be made in the form of rows of profiled elements. In particular, these elements can be made in the form of substantially circular shaped pins fins.

As a particular embodiment of the invention, the heat exchanging channels may be made spiral-like and bent in the direction of centrifugal disk blower rotation. This will provide for the prolonged contact between the airflow and heat exchange element surface. In the latter case the heat exchanging channels may be made of constant width. This will make it possible to ensure the constancy of velocity at which the airflow blows the surfaces of heat exchanging channels, making heat exchanging channels of constant width would enable one to attain the maximum "density" of heat exchanging channels on the heat exchange element surface, which would result in obtaining greater heat exchange area.

When making heat exchanging channels spiral-like especially when they are made of constant width it is advisable to orient their inlets in the direction of the propagation of the output flow produced by disk centrifugal blower. In this case the best matching between the channels and incoming airflow is attained, that would sustain the airflow velocity at the maximum possible level.

In addition, the heat exchanging channels covered with the stator plate from above secured to the surface of the heat exchange element. In this case the entire cooling airflow will propagate only along the channels that also facilitates the improved heat exchange.

BRIEF DESCRIPTION OF THE DRAWINGS

FIG. 3 is a general view showing a blower in the first embodiment;

FIG. 4 is a sectional view taken along line 4—4 FIG. 3;

FIG. 5 is a bottom view of the blower of FIG. 1;

FIG. 6 is a general view of the rotor flat type disk of an electric drive of FIG. 1;

FIG. 7 is a sectional view taken along line 7—7 FIG. 6;

FIG. 7A is a sectional view taken along line 7—7 FIG. 6 when rotor is made from magnetized material;

FIG. 8 is a sectional view on a magnet ring disk of an electric drive of FIG. 1;

FIG. 11 is a plane view showing the embodiment of an electro drive motor of the present invention;

FIG. 12 is a sectional side view taken along line 12—12 FIG. 11;

FIG. 12A is a sectional side view taken along line 12A—12A FIG. 11;

FIG. 23 is a side sectional view showing the fifth embodiment of the present invention;

FIG. 23A is a side sectional view showing the disk with additional projection in the fifth embodiment of the present invention;

FIG. 24 is a view taken along arrow A—A FIG. 23;

FIG. 25 is a sectional view taken along line 25—25 FIG. 23;

DETAILED DESCRIPTION OF PREFERRED EMBODIMENTS

Figure 1:
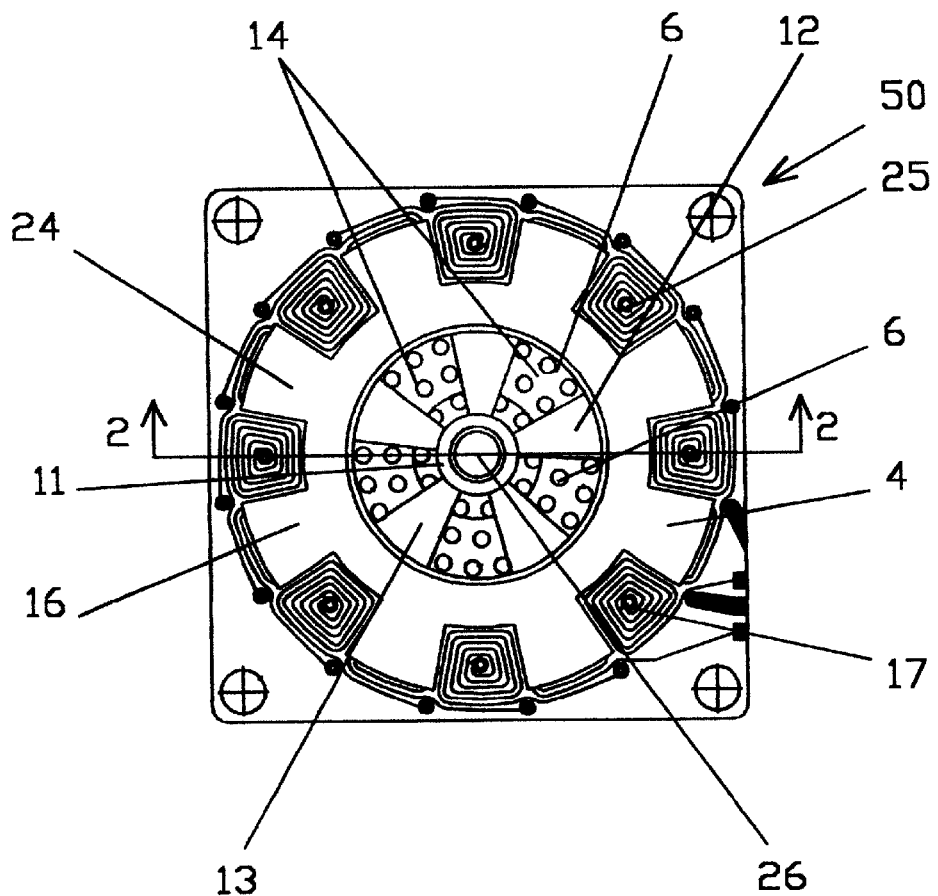
FIG. 1 is a general view showing a first embodiment of the present invention.
Figure 2:
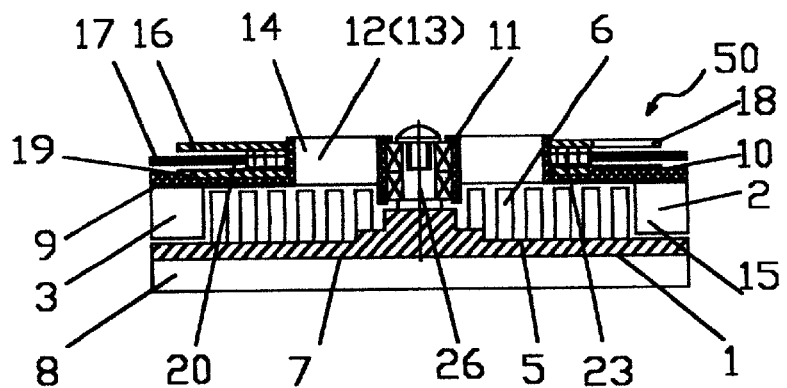
FIG. 2 is a sectional view taken along line 2—2 FIG. 1.
Figure 1A:
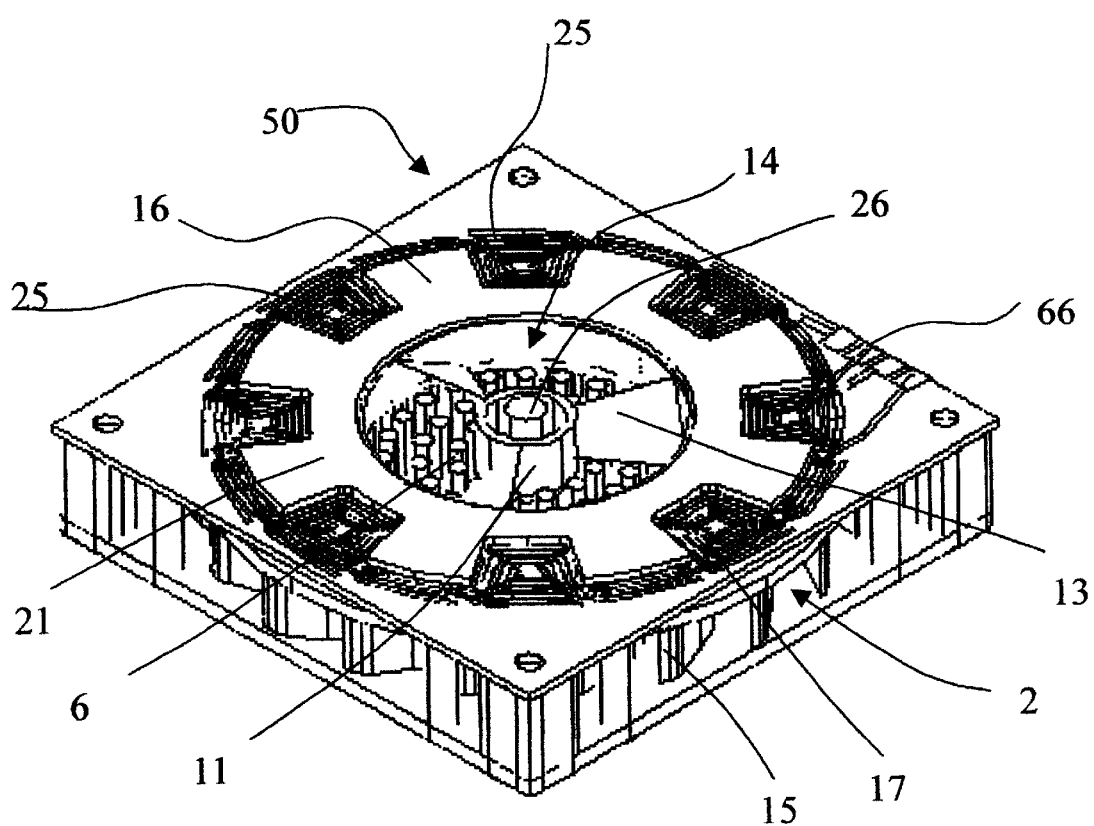
FIG. 1A is a perspective view showing a first embodiment of the present invention.
Figure 1B:
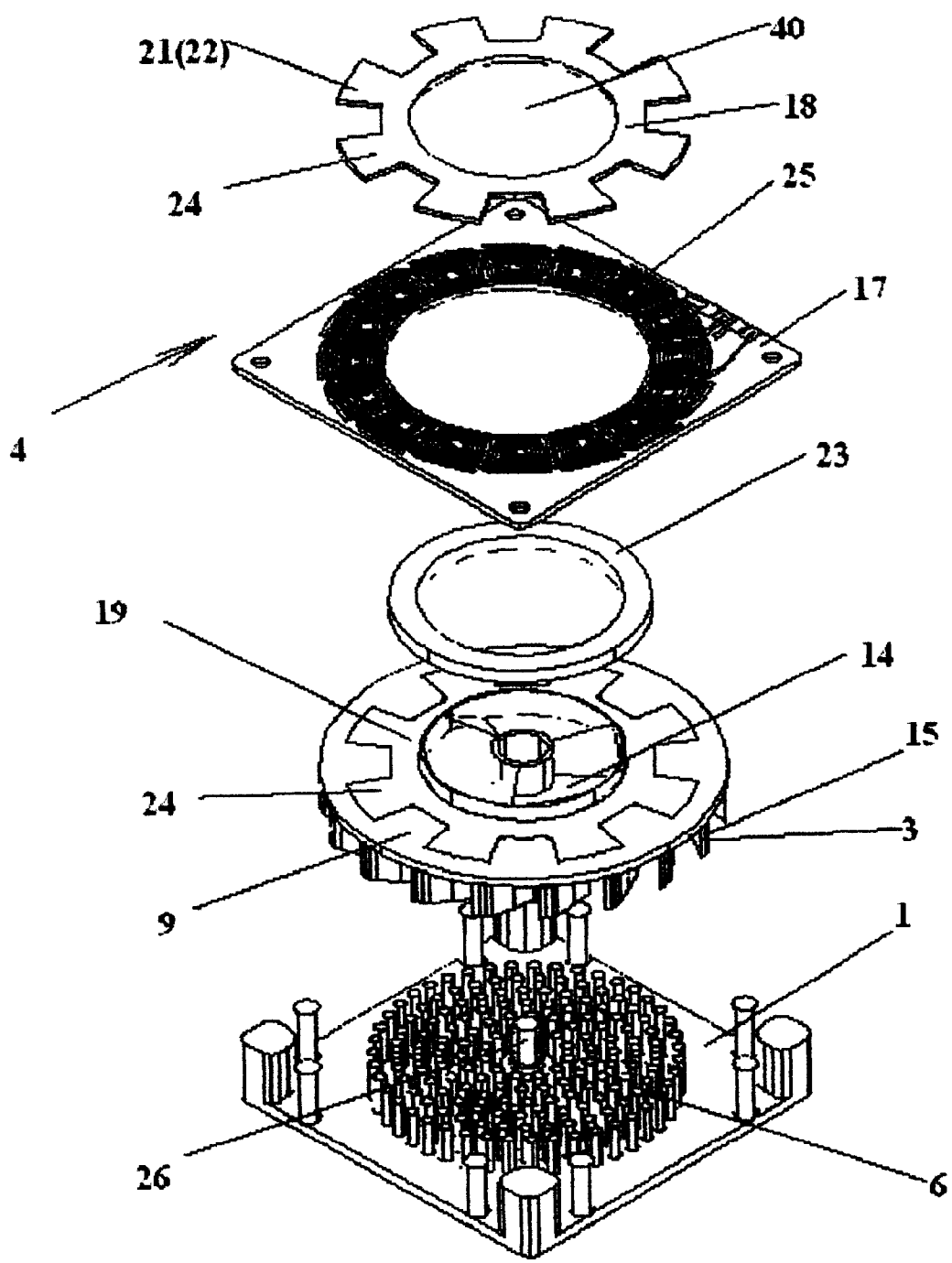
FIG. 1B is an exploded perspective view showing a first embodiment of the present invention.
Figure 9:
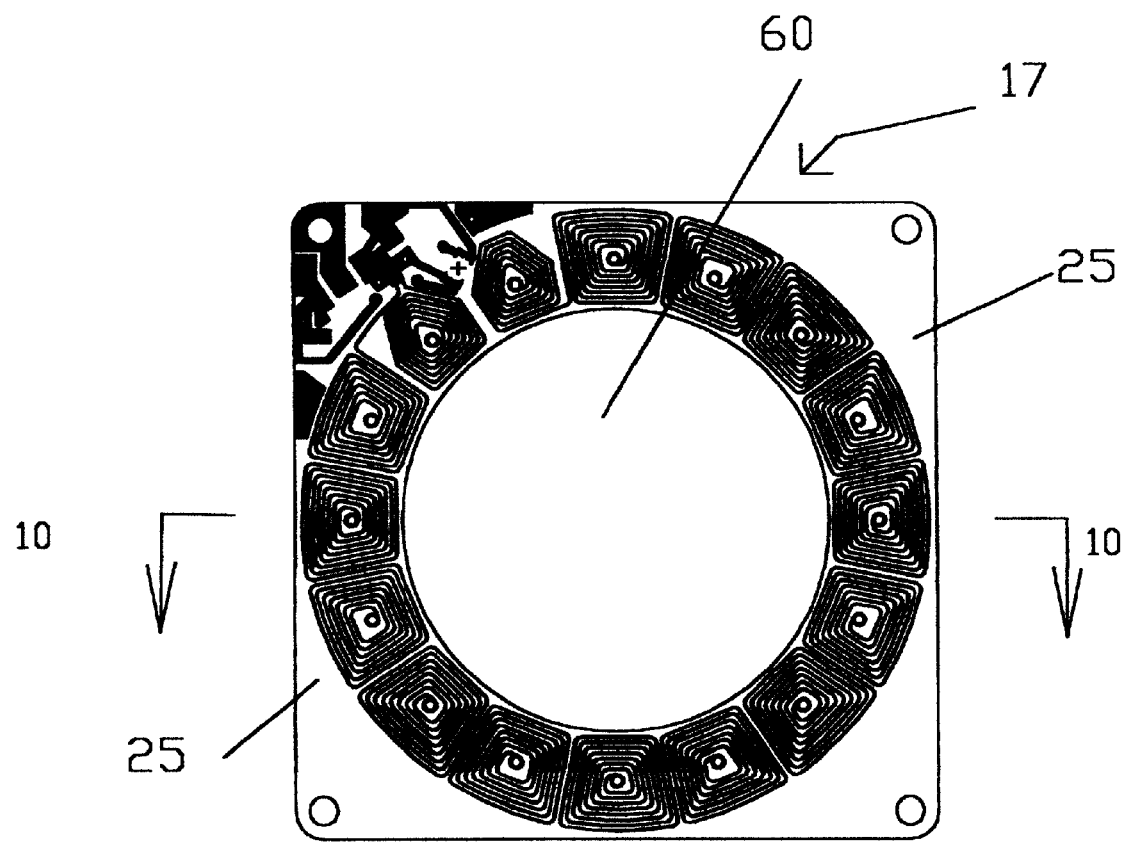
FIG. 9 is a general view of a flat type stator of the electric drive of FIG. 1.
Figure 10:
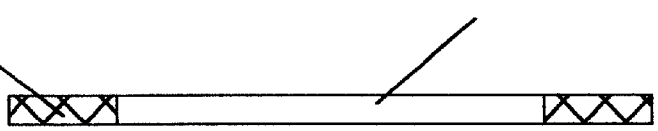
FIG. 10 is a sectional view taken along line 10—10 FIG. 9.

Preferred embodiments of the present invention will be described in detail below with reference to the accompanying drawings FIGS. 1–10 show a first embodiment of the present invention.

A cooler 50 for electronic devices comprises a heat exchange element—heat sink 1, a blower 2 with a radial type impeller 3, and an electric drive 4. The heat sink 1 having an upper surface 5, on which a plurality of radiating pin (fins) 6 are formed. A lower surface 7 of the heat sink 1 is attached to a heat radiating means—an electric device 8 such as a semiconductor device, for example, a CPU, a microprocessor or the like by, for example, an adhesive.

The radial type impeller 3 shown on FIGS. 1B, 3–5 comprises a shroud 9 with a flat surface 10 from one side, a hub 11 and brackets 12, which may be made in form of blades 13 of an axial fan. The bracket 12 connects the hub 11 with the shroud 9.

An area between the hub 11 and the shroud 9 constitutes a central inlet 14 of the radial type impeller 3. On FIGS. 3–5 the radial type impeller is a centrifugal impeller with blades 15.

The radial type impeller 3 (see FIGS. 1, 1B and 2) is positioned on the heat sink 1 so that the radiation pin (fins) 6 are surrounded by the blades 15 of the radial type impeller 3 and a cooling gas flows to the blades 15 of the radial type impeller 3 from the central inlet 14 through the radiation pin (fins) 6.

The electric drive 4 may be different flat type electric motor with a ring like hole 40 in the central part comprises a magnetic rotor 16 and a stator 17. (The electric drive 4 shown on FIG. 1B and separately on FIGS. 11, 12).

Preferable the magnetic rotor 16 (see FIGS. 1, 1B and 2 and FIGS. 6–8, 11, 12) comprises two substantially flat rings 18 and 19 having a hole 40 inside said rings 18, 19 and said circumferential arrayed like poles of one of the magnetized ring being magnetized in opposite polarity and coincide to the circumferential arrayed like poles of another magnetized ring in a projection at a plane normal to the axis of rotation said at least two flat rings installed with a gap 20 between the substantially flat rings 18 and 19 in a place, where the magnetic rotor 16 interact with the stator 17 and with a contact between said substantially flat rings 18 and 19 axially beyond the gap 20. The substantially flat rings 18 and 19 have poles 21 which are distributed over the outer circumference 22 of each flat rings 19 and 18. Said circumferential arrayed like poles 21 of one of the magnetized ring 18 are magnetized in opposite polarity and coincide to the circumferential arrayed like poles 21 of another magnetized ring 19 in a projection at a plane normal to the axis of rotation. A cylindrical magnet 23 that is magnetized in the axial direction is placed between the substantially flat rings 18 and 19.

The best result may be achieved when the flat rings 18, 19 are magnetized in a such way that the poles 21 of each flat rings 18, 19 are like poles, while in relation to the poles 21 of another flat rings they are unlike poles. Teeth 24 on the outer circumferences 22 of the flat rings 18, 19, make the poles 21. The teeth 24 coincide along a direction of a rotation axis.

One of the flat rings 18 of said magnetic rotor 16 is placed on the shroud 9 of the radial type impeller 3. A shaft 26 of the electric drive 4 is located inside the hub 11 of the radial type impeller 3. The hole 40 inside the rings 18, 19 is substantially coincided with the central inlet 14.

The stator 17 (see FIGS. 1, 1B and 2 and FIGS. 9, 10, 11, 12) is made in the form of metallic coils 25 arranged in a circular pattern, where the coils 25 interact with the magnetic rotor poles 21. One of the flat rings 18 of the magnetic rotor 16 is placed flush-mounted with the flat surface 10 of one side of the shroud 9 of the radial type impeller 3 (see FIG. 1B).

As describe above the electric drive 4 is a flat rotor type DC brushless motor. The motor gains a rotation torque attributed to an interaction between a magnetic field produced by many-poles magnetized rotor 16 and magnetic field produced by exciting coils 25 of the stator 17 so as to be rotated in one direction. The stator coils 25 cores is connected with a controller 66, for example of type Fairchild NDS8858H.

The rotor 16 of the electric drive 4 comprising two disks mounted on a shaft with poles distributed over the outer circumference and a cylindrical magnet located between the disks and magnetized in the axial direction, in a such manner that the poles of each disk are the like ones, and in regard to the poles of the other disk—the unlike ones, the stator being made of coils distributed over the circumference, while in accordance with the invention the rotor poles are formed by the teeth located over the outer circumference of both disks in planes perpendicular to the axis of the device, and the poles of the stator coils are arranged in a such way as to allow for their end-face interaction with the rotor poles.

The rotor poles are formed by the teeth located over the outer circumference of both disks, which function as magnetic circuits. This enables streamlined manufacturing of the rotor and achieves strong structural strength. Owing to the fact that the rotor poles are located over the outer circumference of both disks in planes perpendicular to the axis of the device, and the poles of the stator are arranged in a such way as to allow for their end-face interaction with the rotor poles, there arises an opportunity to make the radial size of the device smaller.

As a particular example, the stator poles may be located in the space between the above-mentioned rotor poles outfitted on both disks. This will make it possible to raise the power of the drive, as the magnetic field in the space between the rotor poles will have the highest intensity.

The rotor disks, one or both of them, may be made as flat disks with teeth—poles over the outer circumference, and in this case the rotor poles will be in the same plane with the respective disk, or they may have a plate-like shape. This permits one to obtain the device of the optimum size in dependence of the magnet used, stator, rotor, the required power, and the size of the equipment where the electric drive is supposed to be installed.

Independence of the stator design the rotor poles of one disk may be located in the axial direction both opposite the rotor poles of the other disk, or between them. Taking in view the fact that the operating principle of such devices is based on alternate switching of the stator coils distributed over the circumference, whose magnetic field interacts with the rotor poles, this latter option of rotor poles arrangement provides for a steadier rotation of the rotor, since it practically increases the total number of the rotor poles by a factor of 2.

In addition, the rotor poles on each disk may have an L-shaped pole horn, with one "leg" oriented in the axial direction, and the other one located between the rotor poles of the other disk in the same plane with those. This will make it possible to focus the magnetic field of the rotor thus increasing the power of the electric drive.

The rotor 16 may be manufactured in such way that the disks 18, 19 are integrated with the magnet serving as its poles. This will require a magnet of a sophisticated configuration, (see FIG. 7A) however, eliminating losses in magnetic circuit disks, thereby raising the intensity of the magnetic field in the gap 20 between the rotors poles 21. Another feasible option is to manufacture the magnet of two symmetrical parts joined along the plane perpendicular to the axis of the device. In this case both the manufacturing of the magnet and the assembling process of the device are made easier.

The rotor 16 may be comprised of several sections (not shown on the Figs), each of the several section comprising two disks 18, 19 mounted on the shaft 26 with poles 21 distributed over the outer circumference 22 and a cylindrical magnet 23 located between the disks 18, 19 and magnetized in the axial direction, in a such manner that the poles 21 of one disk 18 are the like ones, and in regard to the poles 21 of the other disk—the unlike ones, the rotor poles 21 of the one disk 18 located between the rotor poles 21 of the another disk 19, and the stator 17 being made of coils distributed over the circumference, while in accordance with the invention in each section of the rotor 16 one or both disks 18, 19 are plate-shaped, and the rotor poles 21 are formed by teeth 24 located over the outer circumference 22 of both disks in the same plane perpendicular to the axis of the device, the poles of the stator coils 25 are arranged in a such way as to allow for their end-face interaction with the rotor poles 21.

FIGS. 11, 12 show the electric drive.

The electric drive shown on this FIGS. 11, 12 is the same as was describe above on FIGS. 1, 2, 6–10 and differs from the described embodiments only in that the one of the flat rings 18 of said magnetic rotor 16 is placed on an annular flat disk 100 made from nonmagnetic material, said annular flat disk 100 being connected by brackets 12 with the shaft 26 of the electric drive 4, and an area inside said annular 100 flat disk coincides with the hole 40.

Other components are the same as in the first embodiment. Therefore the components the same as described above on FIGS. 1, 2, 6–10 are denoted with the same reference numerals, for which description is omitted. The brackets 12 may be made in the form of axial blower blades 13.

This described stator board 17 is constructed for use with the full bridge drive controller 66. The two-phase single ended driver requires a different designed stator board not covered in this description.

The coils on each of the stator boards are arranged in a circular pattern around the axle of the motor rotor (FIG. 1). Half of the coil on one side of the stator board aligns symmetrically, with the center of the coil, to the continuing half coil on the opposite side. This single coil is then series connected with the adjacent coils on the board that are configured with their turns in the opposite direction to yield the opposite magnetic polarity. The coils on each circuit board form a continuous series connection of coils with every adjacent coil having the opposite polarity at any one point in time. The series connection is broken between two of the adjacent coils, on each stator board for electrical lead attachment. The two leads from each of the stator boards can be connected in parallel or series. If connected in series, the remaining lead from each stator board will be attached to the full bridge motor driver. If connected in parallel, each of the two connected leads will be attached to the full bridge motor driver.

Mechanically the stator circuit boards are parallel to each other and perpendicular to the axle of the rotor. The face of each circuit board facing the rotor will be polarized so the coils aligning directly across the rotor poles and have opposite polarities from each other.

The sensing element used to control commutation of this motor is a Hall effect switch or Hall effect element. An optical device may also be used but has limitations because of interference from ambient light sources. The Hall device is located in close proximity to the rotor and positioned to achieve proper rotational direction and optimum performance from the motor.

The motor drive electronics can be a full bridge drive or a two-phase single ended drive. The single ended drive stator boards require a differently constructed stator board. This stator board requires two groups of coils wound in the same direction and having common magnetic polarities. One end of this group of coils is connected together and ties to either the positive or negative lead of the motor power supply.

The operation and design of an electric drive 4 of preferred type (without central hole) may, as an example, be described in U.S. patent application. Ser. No. 09/621,104 for ELECTRIC DRIVE OPTIONS, for the same Assignee, which is hereby incorporated by this reference for all that disclosed therein.

Rotation of the impeller 3 causes generate an air flow suction moving the cool air to come into the central inlet 14 and cool the pins fins 6 and the central part of the heat sink 1.

Figure 13:
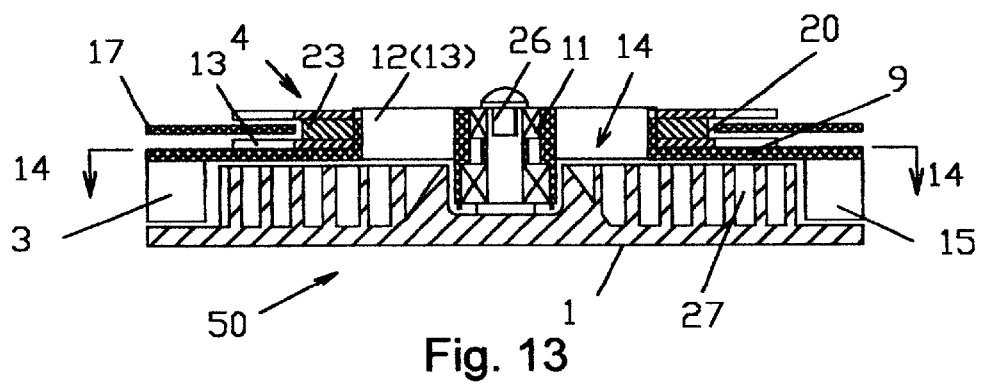
FIG. 13 is a sectional side view showing the second embodiment of the present invention.
Figure 14:
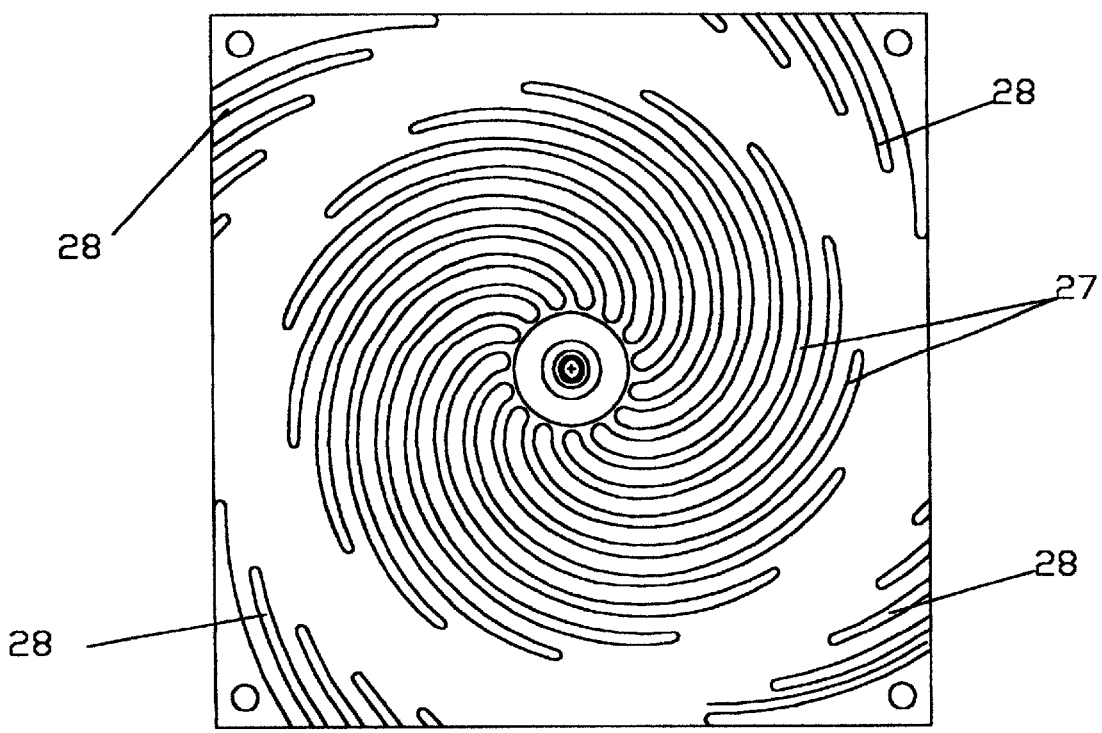
FIG. 14 is a sectional plan view taken along line 14—14 FIG. 13.

FIGS. 13, 14 show a second embodiment of the present inventions.

The second embodiment differs from the first embodiment only in that the heat sink 1 comprises radiation fins 27 in form of spiral in the central inlet 14. Radiation fins 28 are install after impeller blades 15 in corners of the heat sink 1 having square form.

Other components are the same as in the first embodiment. Therefore the components the same as in the first embodiment are denoted with the same reference numerals, for which description is omitted.

FIGS. 15–19 show a third embodiment of the present invention.

The third embodiment differs from the first embodiment only in that the heat sink 1 comprises additional radiation fins 29. Other components are the same as in the first embodiment. Therefore the components the same as in the first embodiment are denoted with the same reference numerals, for which description is omitted.

These additional radiation fins 29 that are installed after impeller blades 15 formed heat-exchanging channels 30.

Figure 15:
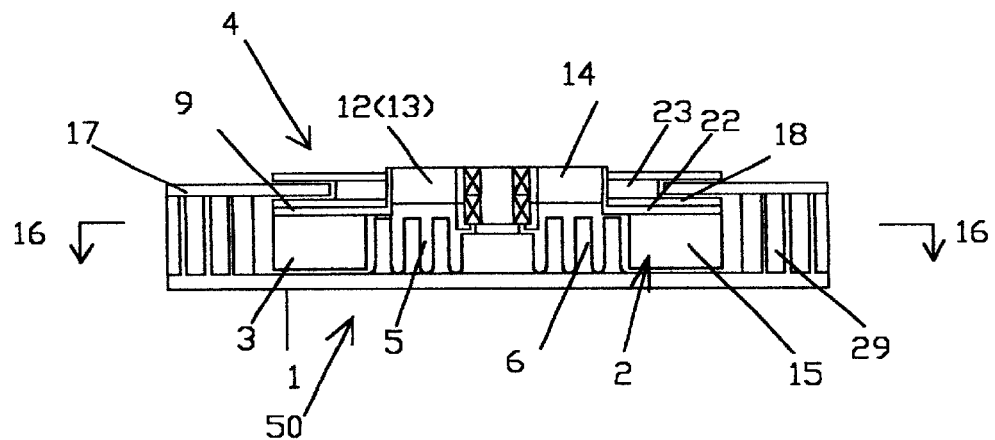
FIG. 15 is a sectional side view showing the third embodiment of the present invention.
Figure 16:
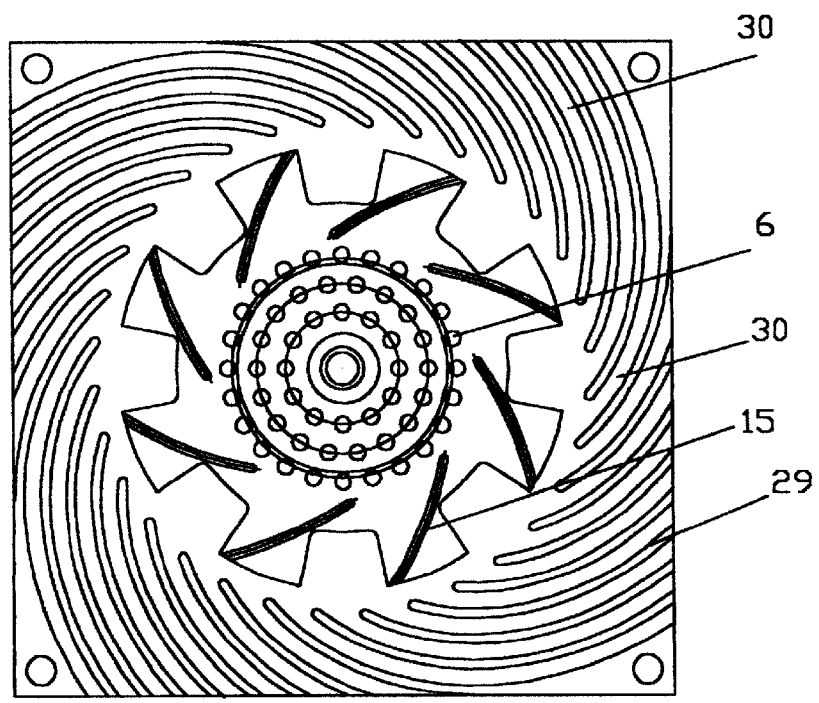
FIG. 16 is a sectional plan view taken along line 16—16 FIG. 15.

FIG. 16 is a modification of a third embodiment of the present invention shown on FIG. 15 with radially diverging spiral—like heat exchanging channels 30.

Figure 17:
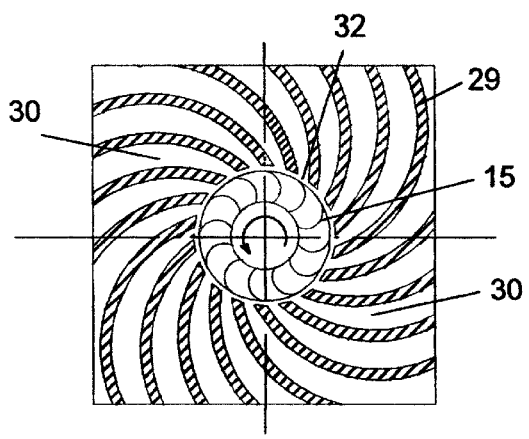
FIG. 17 is a modification of FIG. 16 with radially diverging spiral-like heat exchanging channels.

FIG. 17 is a modification of a third embodiment of the present invention shown on FIG. 15 with spiral—like heat exchanging channels 30 of constant width.

Figure 18:
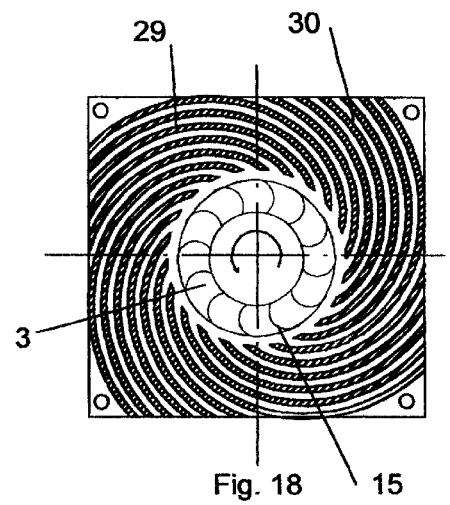
FIG. 18 is a modification of FIG. 16 with spiral-like heat exchanging channels of constant width.

FIG. 18 is a modification of a third embodiment of the present invention shown on FIG. 15 with spiral—like heat exchanging channels 30 formed by rows of cylindrical shaped profiled pins 31.

Figure 20:
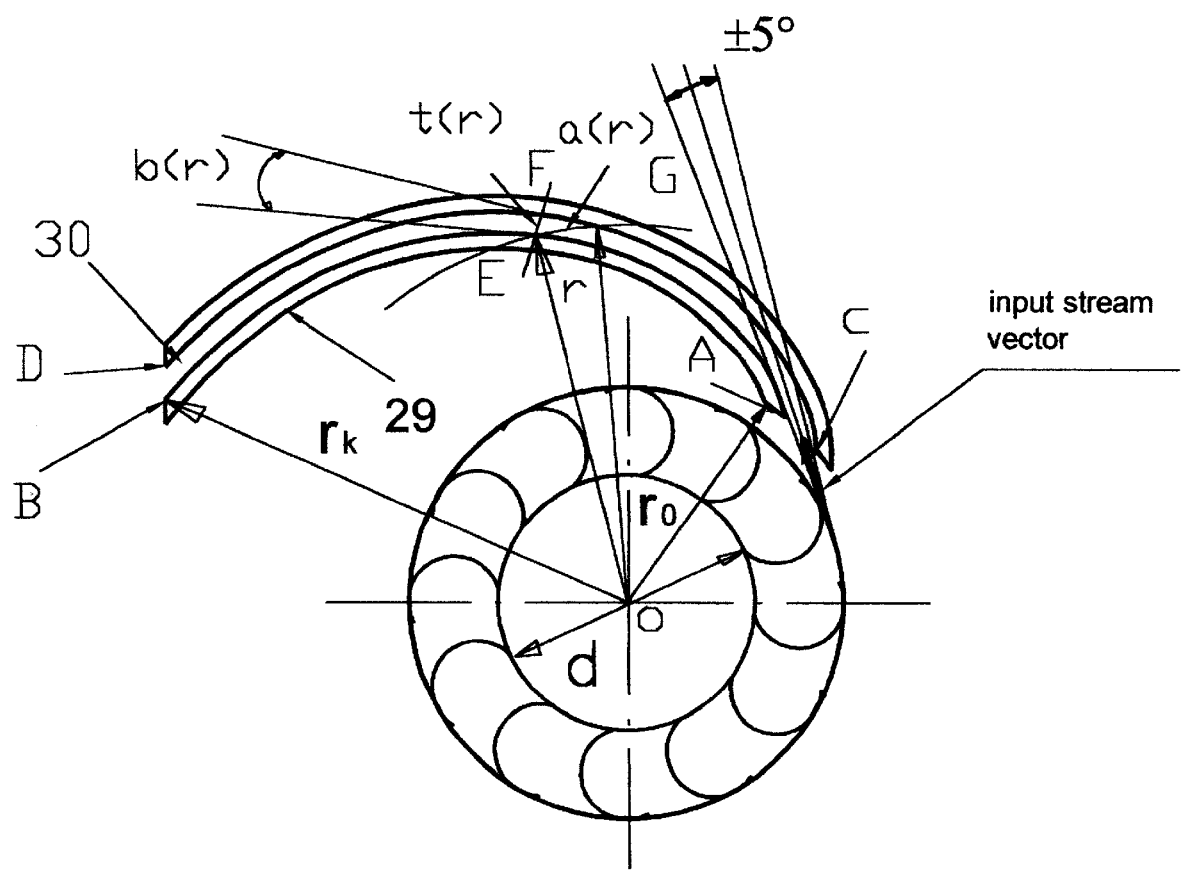
FIG. 20 is an illustration to geometric relationships for calculation of the profile of spiral-like heat exchanging channels of constant width.

FIG. 20 is an illustration to geometric relationships for calculation of the profile of spiral—like heat exchanging channels 30 of constant width.

In the embodiments of the cooler for electronic device presented in FIGS. 15–20 inlets 32 of heat exchanging channels 30 are oriented in the direction of propagation of the output flow produced by radial type impeller 3. It is best to orient the inlets 32 of heat exchanging channels 30 in a such way that an angle between an axis of heat exchanging channel inlets 32 and the direction of incoming airflow produced by impeller 3 will lie within a range ±5° (see FIG. 20).

FIG. 20 shows heat exchanging channel 30 formed by two additional radiation fins 29 (arc AB and arc CD) and corresponding geometric constructions needed for the calculation of the profile of heat exchanging channels 30 of constant width. For an arbitrary point E of arc AB located at distance r from center of symmetry O and point F (corresponding to said point E) of arc CD [the distance between two said points t(r) represents the width of the heat exchanging channel 30], point G of arc CD located also at distance r from the center of symmetry O is determined. Distance a(r) between point E and point G for a great number of heat exchanging channels Z is approximately equal to the length of arc EG—i.e. $a(r) \approx 2\pi r/Z$. Under the same conditions the value of t(r) may be defined as $t(r) \approx a(r) \cdot \sin[b(r)]$. Using numeric methods it is possible to calculate for $t(r)=T$ (where T=const) the values of angle b(r), thus determining the profile of the heat-exchanging channel 30. In particular, FIG. 17 present an example of the design with a number of heat exchanging channels Z=22 and relationship between minimal distance $r=r_0$ (point A) and maximum distance $r=r_k$ (point B): $r_0=0.4r_k$. For the given case, the values of angle b(r) were determined, said values being within the range from $b(r_0)=34,22°$ to $b(r_k)=13,0°$.

To improve heat exchange process, the surface of heat exchanging element 101 located underneath the central inlet of the centrifugal blower 3 comprising rows of cylindrical shaped profiled pins 31.

In relation to the inlets 32 of the heat exchanging channels 30 blades 15 of centrifugal blower 3 is installed with radial gap, the value of which is no less than 0.03d, where d is the diameter of impeller 3 of centrifugal blower 2.

Figure 19:
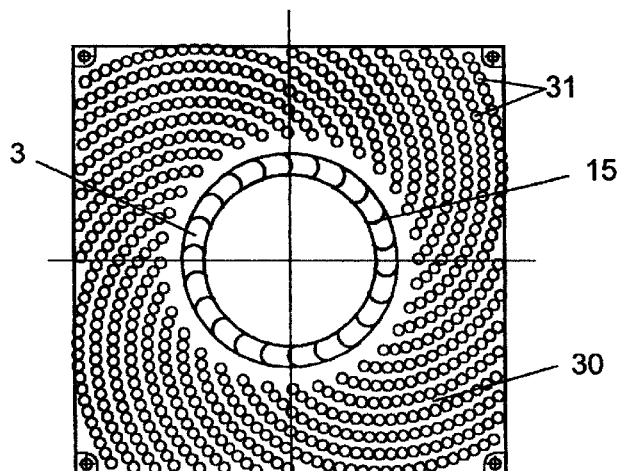
FIG. 19 is a modification of FIG. 16 with spiral-like heat exchanging channels formed by rows cylindrical needle-shaped profiled pins.

Heat exchanging channels 30 may be formed by the rows of profiled elements of circular, rectangular or other cross sectional shapes. The said profiled elements may be made so that they are located immediately adjacent to one another (as shown in FIG. 19) where they are made in the form of cylindrical pin fin 31. These profiled elements may be produced by making saw cuts in additional radiation fins 29 that formed channels 30 (for instance, in additional radiation fins 29—see FIG. 18).

For all of the above-presented embodiments, heat exchange element 1 may be fabricated by different methods (for instance, by casting or milling).

When electro drive 4 begins to rotate, the blower 2 with the radial type impeller 3 having the shroud 9 also begins rotating because the shroud 9 is fixed to the rotor 16 of the electric drive 4. The brackets 12 that are made in form of blades 13 of the axial fan begin rotating too. It supplies cooling flow (for instance, airflow) to the central part of heat exchange element 1. Since the blower 2 is located right opposite the inlets 32 of said heat-exchanging channels 30, the cooling flow is then supplied to channel inlets 32 and as it moves by said channels 30 it cools the heat exchange element 1 down.

Since the blower 2 is installed at the same level as the heat exchanging channels 30, the size of the device in height is reduced and the cooling flow is directed into the heat exchanging channels 30 without energy expenditures caused by turning the flow from the axial direction to the radial direction. The latter is explained by the fact that flow turn is effected owing to the properties of centrifugal blower design.

The specific features of the present invention mentioned above provide for a special cooling pattern, in which the hottest part of the heat exchange element 1, namely, its central part gets cooled first, and, as compared to the conventional coolers, the entire cooling process proceeds more evenly without losses by flow turn and friction when the cooling flow going from the impeller 3 enters the heat exchanging channels 30. As a consequence, when using the present invention one would need a blower 2 of lesser power and size.

It is advisable that centrifugal blower 2 be equipped with an impeller 3 of drum type. In this case the impeller 3 has a large enough air entrance area making it possible to produce a powerful flow to cool the central part of the heat exchange element 1. For a given blower capacity, a centrifugal blower 2 with a drum-type impeller 3 has minimal size and rotational speed as compared to centrifugal blowers with an impeller of other type. For example, tested sample according present invention has the following dimensions 52×52×12 mm and its thermal performance is characterized by the value of thermal resistance about 1.1–1.2° C./W at 4000 rpm.

For the purpose of increasing heat exchange area, the heat exchanging channels 30 can be made in the form of rows of profiled elements (see FIGS. 17–19). In particular, these elements can me made in the form of cylindrical fins 29 (see FIG. 19).

As a particular embodiment of the invention, the heat exchanging channels 30 may be made spiral-like and bent in the direction of centrifugal blower rotation. This will provide for the prolonged contact between the airflow and heat exchange element surface.

In addition, the heat exchanging channels 30 may be made of constant width. This will make it possible to ensure the constancy of speed at which the airflow blows the surges of heat exchanging channels 30. Making heat-exchanging channels 30 of constant width would enable one to attain the maximum "density" of heat exchanging channels 30 on the heat exchange element 1 surface, which would result in obtaining greater heat exchange area.

When making heat exchanging channels 30 spiral-like or of constant width it is advisable to orient their inlets 32 in the direction of propagation of the output flow produced by centrifugal blower impeller 3. In this case the best matching between the channels 30 and incoming airflow is attained, which, in its turn, would sustain the airflow speed at the maximum possible level.

Figure 21:
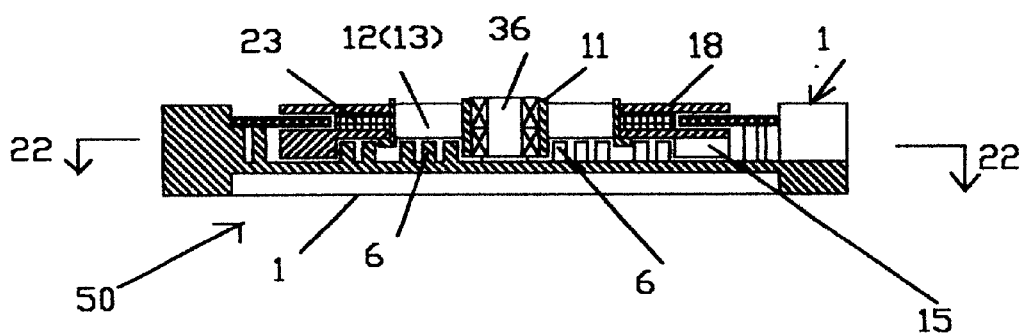
FIG. 21 is a side sectional view showing the fourth embodiment of the present invention.
Figure 22:
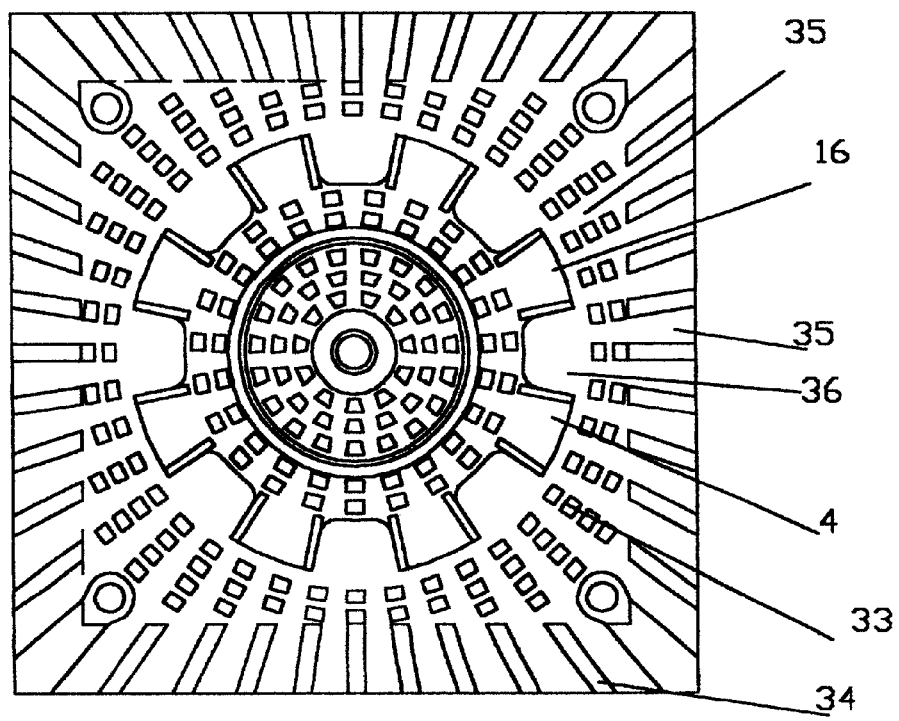
FIG. 22 is a sectional plan view taken along line 22—22 FIG. 21.

FIGS. 21, 22 show a fourth embodiment of the present invention.

The fourth embodiment differs from the first embodiment only in that the heat sink 1 comprises additional radiation pins 33 and additional radiation fins 34 that are installed after impeller blades 15. Other components are the same as in the first embodiment. Therefore the components the same as in the first embodiment are denoted with the same reference numerals, for which description is omitted.

These additional radiation pins 33 and fins 34-formed divergent heat-exchanging channels 35. Inlets 36 of said channels 35 are after impeller blades 15.

The present invention in the third and fourth embodiments (FIGS. 13–20) operates in the following manner.

When impeller 3 of centrifugal blower 2 rotates the airflow at first blows over the central part of heat exchange element 1, including its radiation pins fins 6. Intensive heat exchange proceeds in this area of heat exchange element 1, which is the hottest area of said heat exchange element 1. Impeller 3 of centrifugal blower 2 supplies the airflow to inlet 32 of heat exchanging channels 30. In the case when heat exchanging channels 30 are made spiral-like and bent in the direction of rotation of blower 2 (see FIGS. 17–19) the airflow is directed to channels 30 without deceleration, which means that there is no loss in airflow speed when it enters channel 30. The airflow speed in heat exchanging channels 30 of constant width (see FIG. 18) is kept constant. Heat exchange between heat exchange element 1 and airflow takes place when the airflow passes by heat exchanging channels 30. As a result of this heat exchange process, an electronic device 8 being in thermal contact with heat exchange element 1 gets cooled down.

FIGS. 23–25 show a fifth embodiment of the present invention. In the fifth embodiment the electric drive 4 is the same as in first four embodiments described above.

In this embodiment radial type impeller 3 is a disk-type impeller comprising one disk 207. This disk 207 is illustrated on FIG. 24.

Figure 26:
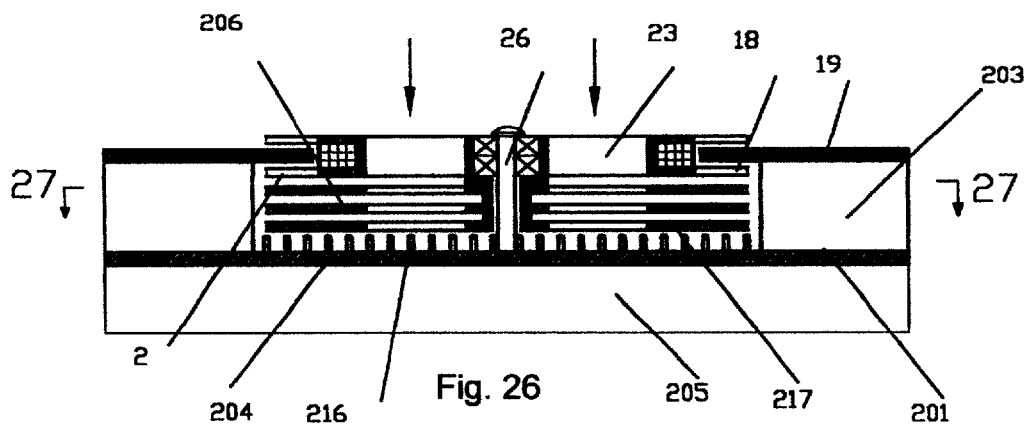
FIG. 26 is a side sectional view showing the sixth embodiment of the present invention.
Figure 27:
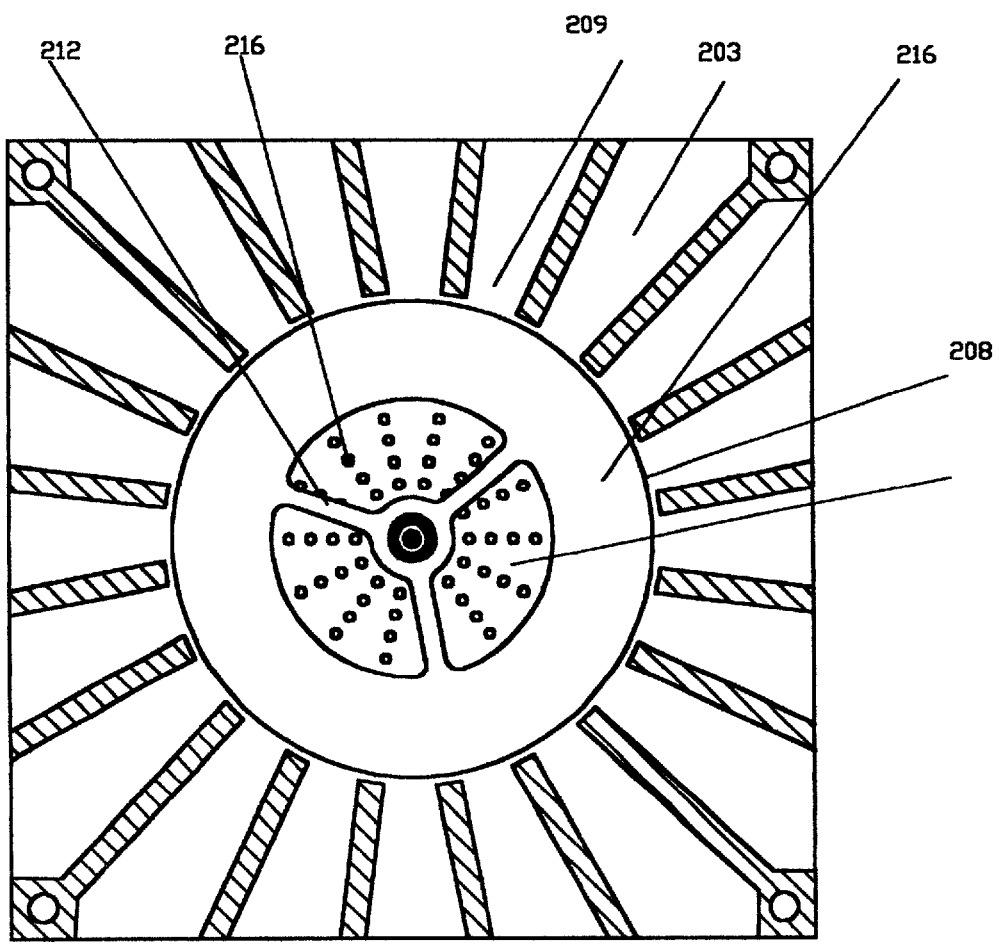
FIG. 27 is a plane view of cross section taken along line 27—27 FIG. 26.

FIGS. 26, 27 show a sixth embodiment of the present invention. In the sixth embodiment the electric drive 4 is the same as in first four embodiments described above.

In this embodiment radial type impeller 3 is a disk-type impeller comprising several disk 217. These disks 217 have the same design as disk 207 shown on FIGS. 23, 24.

The cooler for electronic devices (FIGS. 23–27) comprises a heat exchange element 201 with divergent heat exchanging channels 203 made on its one surface 202, while its other surface 204 is made so that thermal contact with an electronic device 205 is possible. The cooler for electronic devices also comprises a centrifugal blower 206 installed on the heat exchange element 201 in a such manner that that it provides for the passing of cooling gas to flow throw the heat exchanging channels 203.

A disk-type centrifugal blower 206 with at least one disk 217 is used in the design. FIGS. 26, 27 presents a sample design of centrifugal blower 206 with four disks 217. Disks 217 are installed in such manner that the edge 208 of each disk surface facing the heat exchange element 201 is located opposite inlets 209 to the heat exchanging channels 203. A cross section of the device having radial heat exchanging channels 203 is shown in FIG. 27.

A design of centrifugal blower 206 with one disk 207 is shown in FIG. 23. In this embodiment heat exchange element 201 may be made of small height.

A design of disk 207 with radial straps 212, with the help of which disk 207 is secured to axle 213 of blower 206, is shown in FIG. 24.

The surface of disk 207 facing heat exchange element 201 may be equipped with radial projection 210 (see FIG. 23A).

The straps 212 may be done as axial blower blades 211 fixed to disk 207 (see FIGS. 24, 25) and installed in the area of central opening 215 of disk 207. FIG. 24 presents an example of device embodiment with blades 211 installed on one disk 207. The device operates in the following manner.

When disks 207 (or 217) of centrifugal blower 206 rotate (see FIGS. 23, 26) the airflow primarily blows over the central part of heat exchange element 201, including its cylindrical pins fins 216. Intensive heat exchange takes place in this area of heat exchange element 201, which is the hottest area of said heat exchange element. Disks 207 of centrifugal blower 206 supply the airflow to inlet 209 of heat exchanging channels 203. In the case when heat-exchanging channels 203 are made spiral-like and bent in the direction of rotation of blower 206, the cooling airflow is directed to channels 203 without deceleration, which means that there is no loss in airflow speed when it enters channel 203. The airflow speed in heat exchanging channels 203 of constant width is kept constant.

Heat exchange between heat exchange element 201 and airflow takes place when the airflow passes by heat exchanging channels 203. As a result of this heat exchange process, electronic device 205 being in thermal contact with heat exchange element 201 gets cooled down.

The airflow produced by disk 207 propagates not only in radial direction, but also in tangential direction. Projection 210 (FIG. 23A) installed on disk 207 augment the radial component of the airflow.

In the case when blades 211 of axial fan are installed in the area of the central opening 215 of disk 207 (FIGS. 23–25) said blades 211 produce additional pressure of airflow, thus facilitating better cooling of the central part, and hence cooling of entire heat exchange element 201.

Application of devices with a centrifugal blower, the impeller of which is located opposite the inlets to heat exchanging channels for the purpose of cooling electronic devices enables one to create effective and small-size devices for said purpose.

The disk-type centrifugal blower is characterized by small size (in terms of height) while being effective enough. In addition, it is also characterized by minimal noise level as compared to other types of centrifugal blowers, all other factors being equal.

The above-mentioned specific features of the device claimed herein provide for a special cooling pattern, which is characterized by the fact that the hottest part of the heat exchange element (namely, its central part) gets cooled first, and, as compared to the above-described prototype, the entire cooling process proceeds more evenly and without losses that are caused in said prototype by flow turn and friction when the cooling flow (going from the blower disk) enters the heat exchanging channels. As a consequence, when using the present invention one would need a blower of lesser power and size.

Axial blower blades may be installed on at least one of the disks of the centrifugal blower near its central opening said blades being attached to the disk. The blades may be installed on one disk or on several disks. Installation of axial blower blades near the central opening of the disk increases the pressure of cooling airflow in the central part of the heat exchange element with the blower capacity being the same. Such a design of the disk-type centrifugal blower coupled with installation of axial blower blades makes it possible to attain the same blower capacity with a lower number of revolutions, which fact results in additional decrease in noise level generated by the blower.

The heat exchanging channels 203 covered with the stator plate 17 of the electric drive 4 from above secured to the surface of the heat exchange element. The cooling airflow will propagate only along the channels, which fact also facilitates the improved heat exchange.

Figure 28:
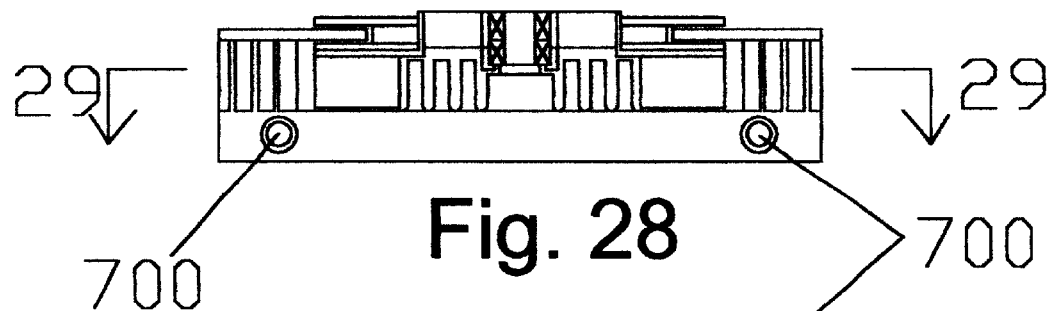
FIG. 28 is a sectional side view showing the seventh embodiment of the present invention.
Figure 29:
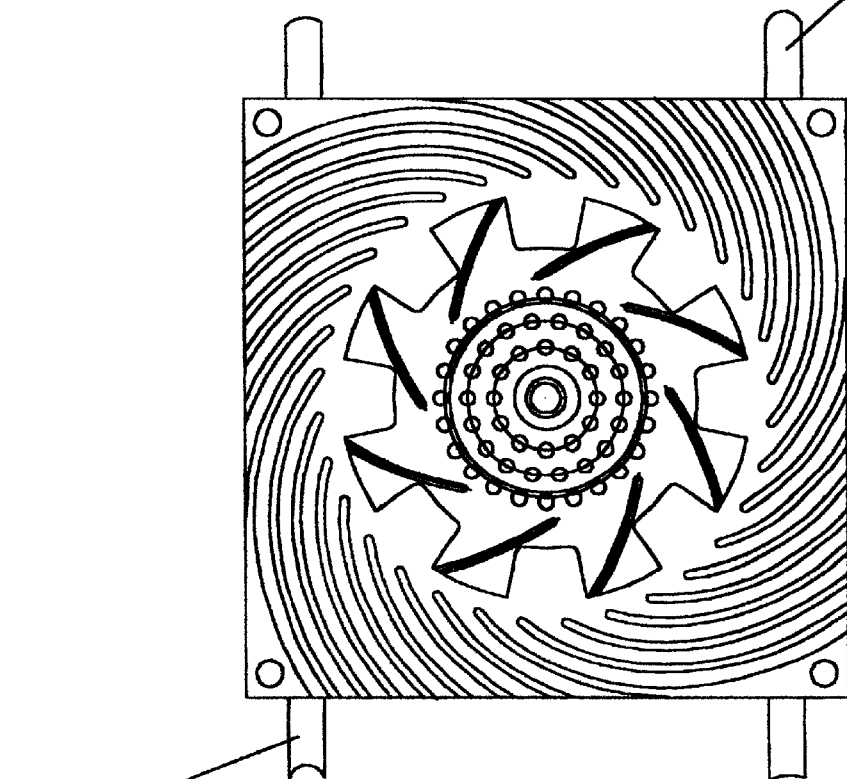
FIG. 29 is a sectional plan view taken along line 29—29 FIG. 28.

FIGS. 28, 29 show a seventh embodiment of the present invention. In this embodiment the cooler for electronic device comprises a heat pipe 700 and heat sink that has the same components as the cooler for electronic device in third embodiment of the present invention (see FIGS. 15, 16). Therefore the components the same as in the first embodiment are denoted with the same reference numerals, for which description is omitted. The design of the heat pipe 700 is conventional type and isn't object of the present invention.

Figure 30A:
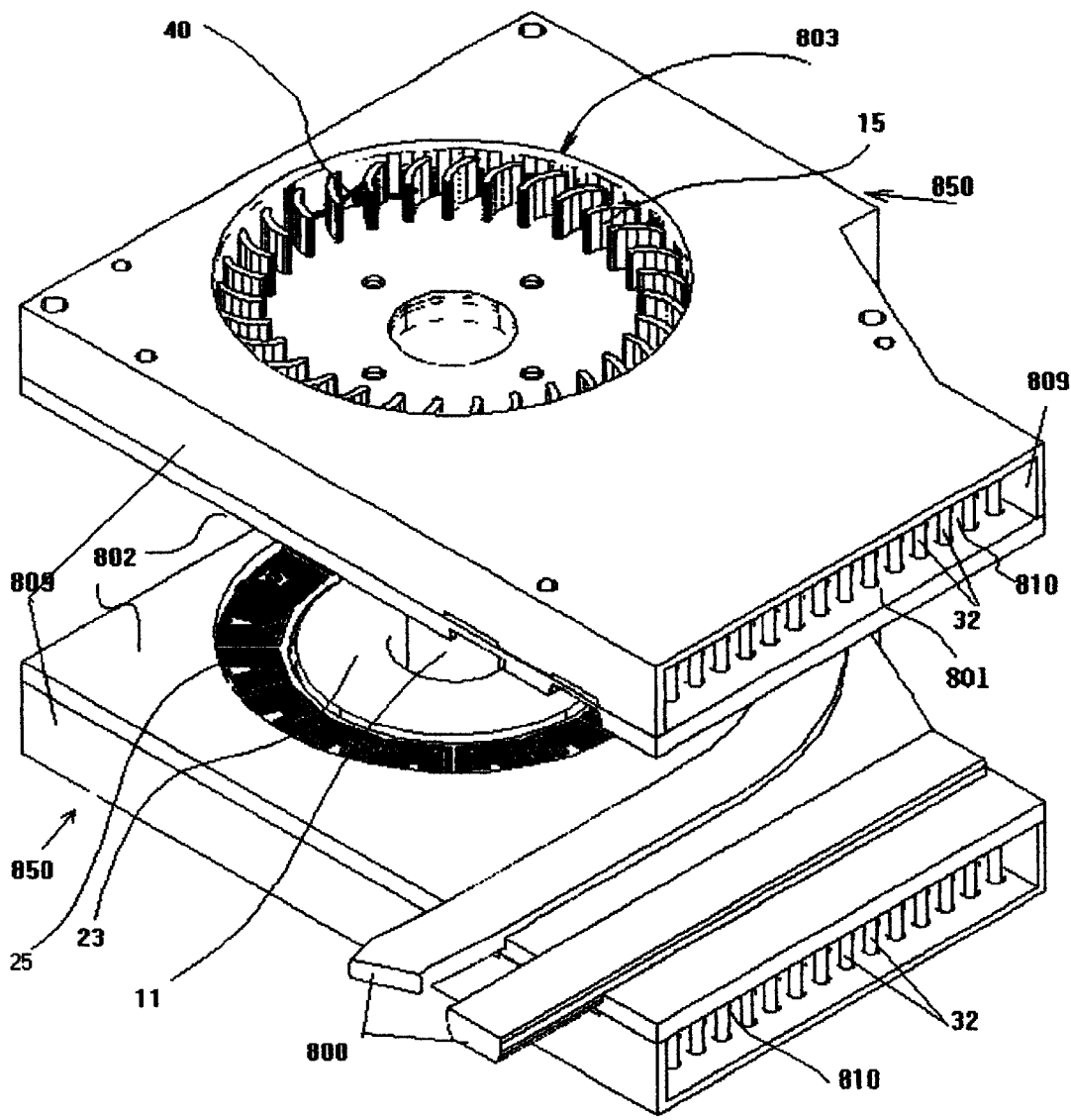
FIG. 30A is an exploded perspective view showing the eight embodiment of the present invention with heat pipes between two cooling devices.
Figure 30B:
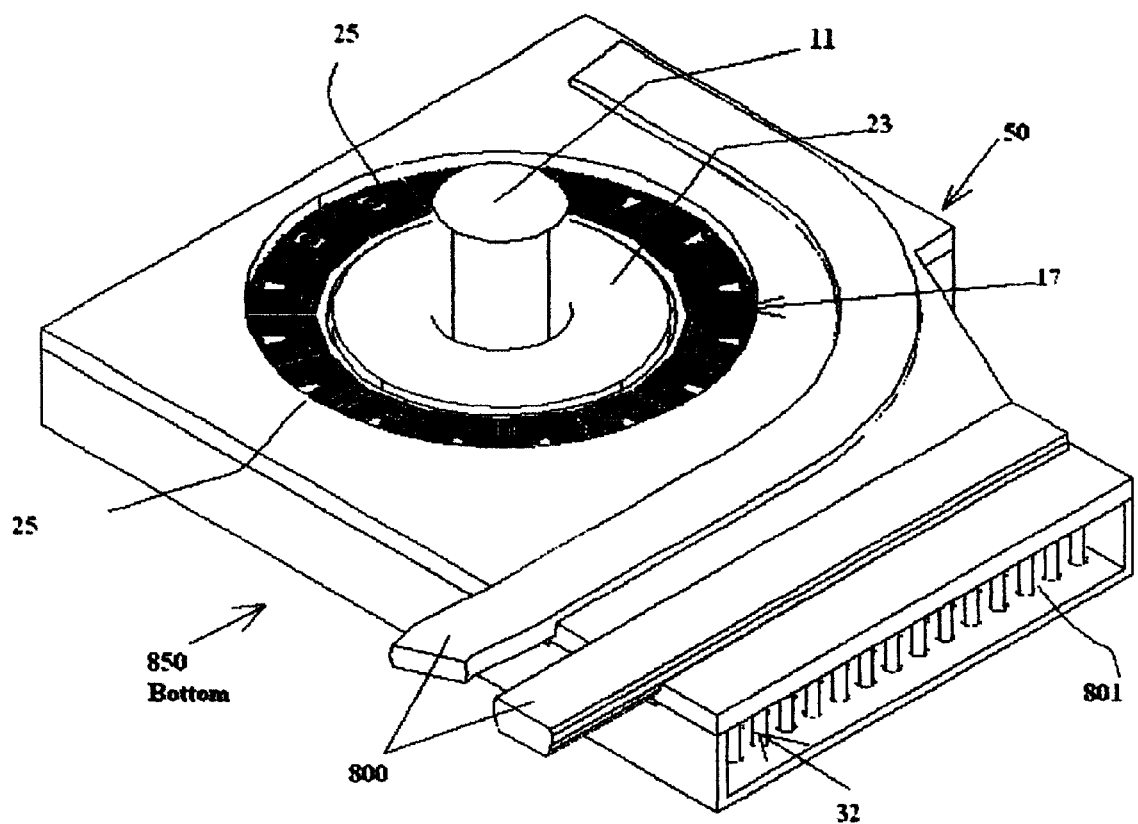
FIG. 30B is a perspective view showing bottom cooling device if FIG. 28A with heat pipes.
Figure 30C:
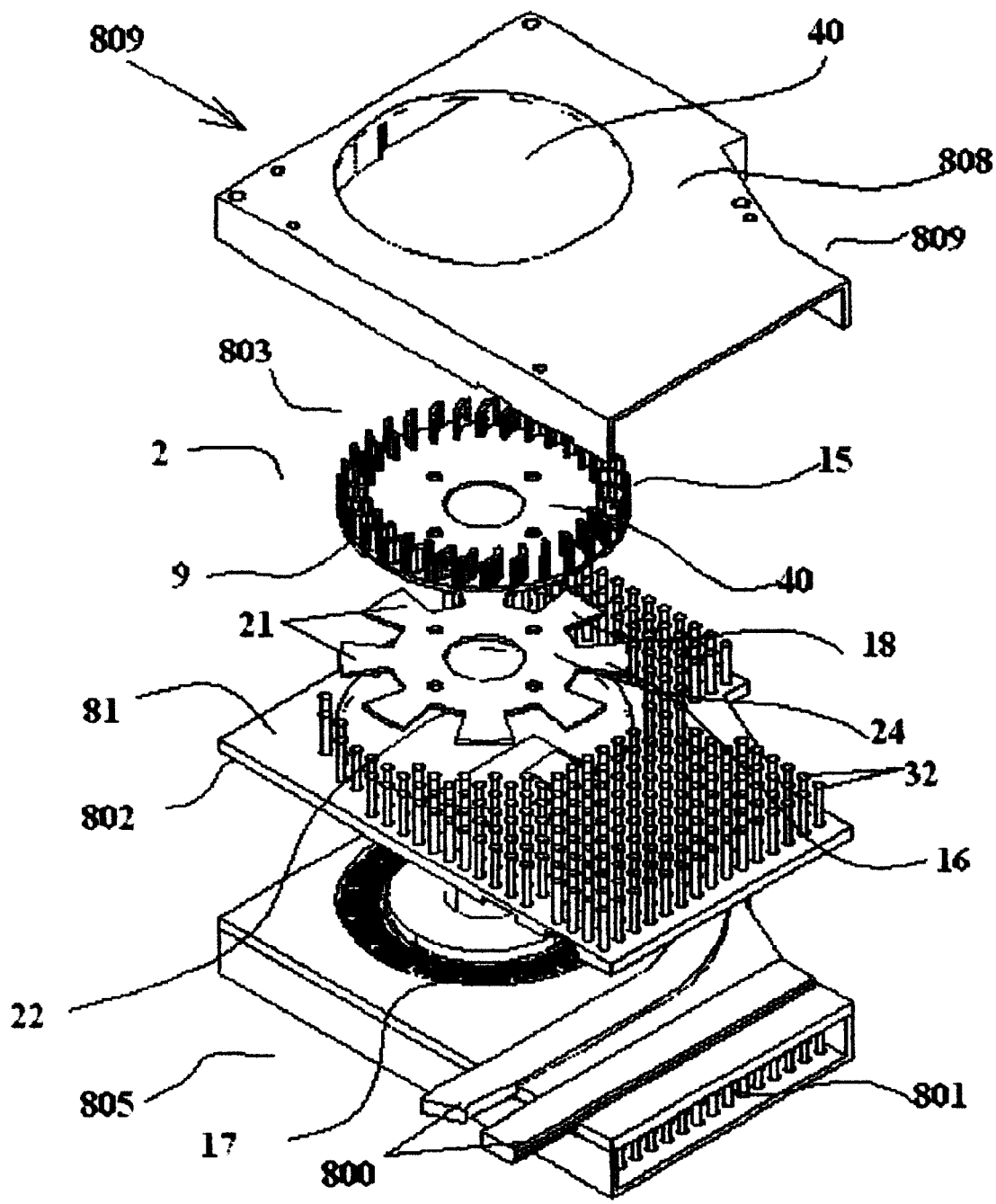
FIG. 30C is an exploded perspective view showing the eight embodiment of the present invention with heat pipes between two cooling devices wherein the upper cooling device is additional exploded.

FIGS. 30A, 30B and 30C show eights embodiment of the present invention. The eights embodiment of the present invention differs from the others embodiments in that embodiment the cooler for electronic devices comprises two coolers that were described above and one electro drive. The components the same as in the previous embodiments are denoted with the same reference numerals, for which description is omitted.

FIG. 30B shows an option of the eight embodiment of the present invention. This option of the eight embodiment of the present invention differs from the eight embodiment only in that the entrance of the bottom impeller in form of ring like hole in the blower.

FIGS. 30A, 30B, 30C, 31A and 31B show the eight embodiment of the present invention. The cooler for electronic devices on FIGS. 30A, 30B comprises at least two heat exchange elements 850, a blower 2 with a radial type impeller 803, and an electric drive. Each of said heat exchange elements 850 having first 801 and second 802 surfaces.

The heat exchange element 850 comprises heat exchanging means 32 made on the first surface 801 of said heat exchange element 850 while its second surface 802 provides thermal contact with a heat-radiating means 800. The radial type impeller 803 in this embodiment is a centifugal impeller and has two shrouds 9 with blades 15. Each of said shrouds 9 has a flat surface from one side, a hub 11 and a central inlet 40 between the blades 15 and the hub 11.

The heat exchanging means 32 are pins or fins that may have cylindrical shape. The heat exchanging means 32 may be covered from upper ends with flat plate 808. The flat plate 808 and sidewalls 809 formed a house with exit 810.

Said radial type impeller 803 is positioned on the heat exchange element 850 so that a cooling gas flows from the central inlet 40 through the radial type impeller 803 and the heat exchanging means 32 to the exit 810 in a series way. The electric drive comprising a magnetic rotor 16 and a stator 17. The magnetic rotor 16 is a substantially flat disk rotor comprises circumferential arrayed like poles 21. The stator 17 comprises circumferential arrayed coils 25, axis of said coils 25 are parallel to the axis of rotation. The coils 25 mounted around of the circumferential arrayed like poles 21. The magnetic rotor 16 is placed on the shrouds 9 of the radial type impeller 803 and connect with the shroud 9. The shaft of the electric drive is located inside the hub of the radial type impeller. The substantially flat disk rotor 16 further comprises at least two magnetized rings 18 and 19 with circumferential arrayed like poles and being mounted perpendicularly to the axis of rotation, and said circumferential arrayed like poles of one of the magnetized ring is magnetized in opposite polarity and coincide to the circumferential arrayed like poles of another magnetized ring in a projection at a plane normal to the axis of rotation, said at least two flat rings 18, 19 installed with a gap between said flat rings in a place, where the magnetic rotor interact with the stator and with a contact between said flat ring axially beyond the gap. The coils 25 of said stator 17 at least partially mounted at the gap between the circumferential arrayed like poles of one of the magnetized ring and the like circumferential arrayed poles of the another adjacent magnetized ring. The heat-radiating means are two heat tubes 800. The heat tubes 800 are in a contact with two second surfaces 802 of said at least two heat exchange elements 850.

Figure 31A:
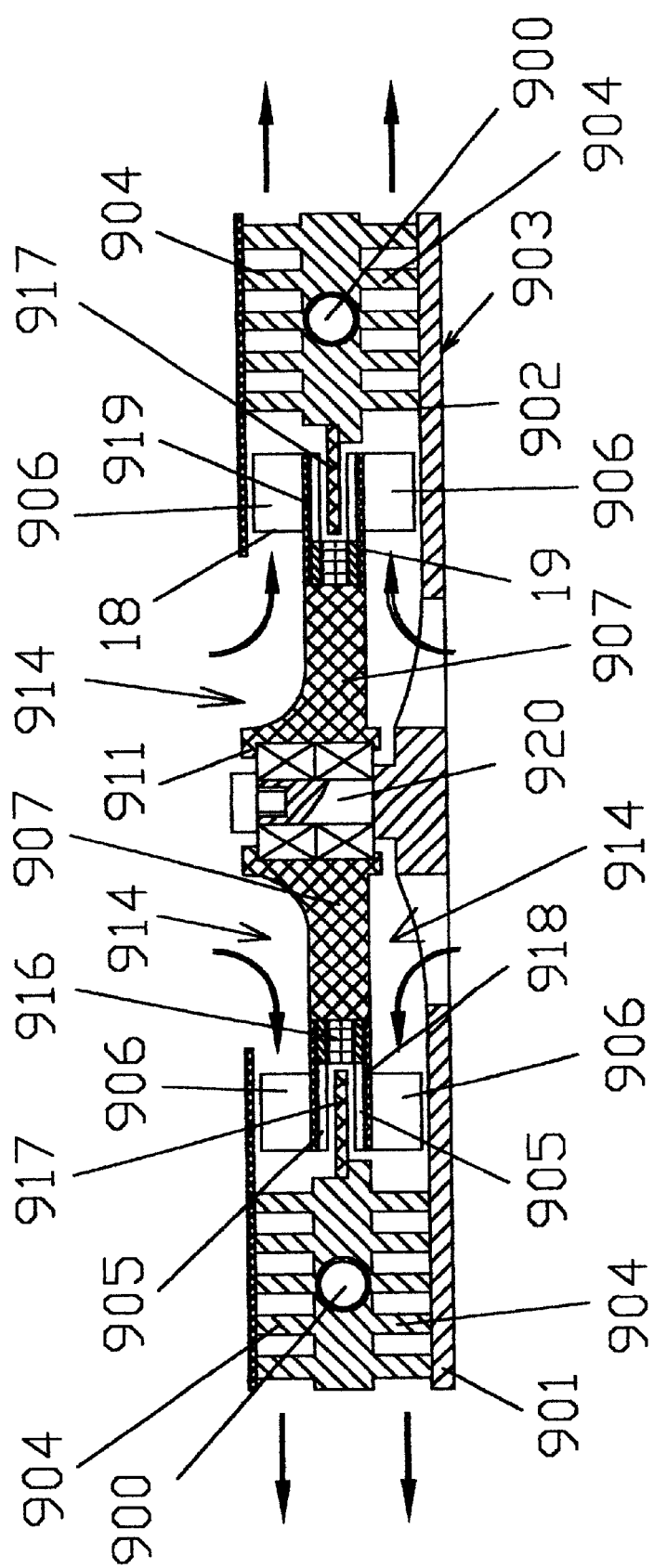
FIG. 31A is a side sectional view showing an option of the eight embodiment of the present invention with one electro drive and a flat heat pipe between two cooling devices and enter of the cooling gas from two sides of the blower.
Figure 31B:
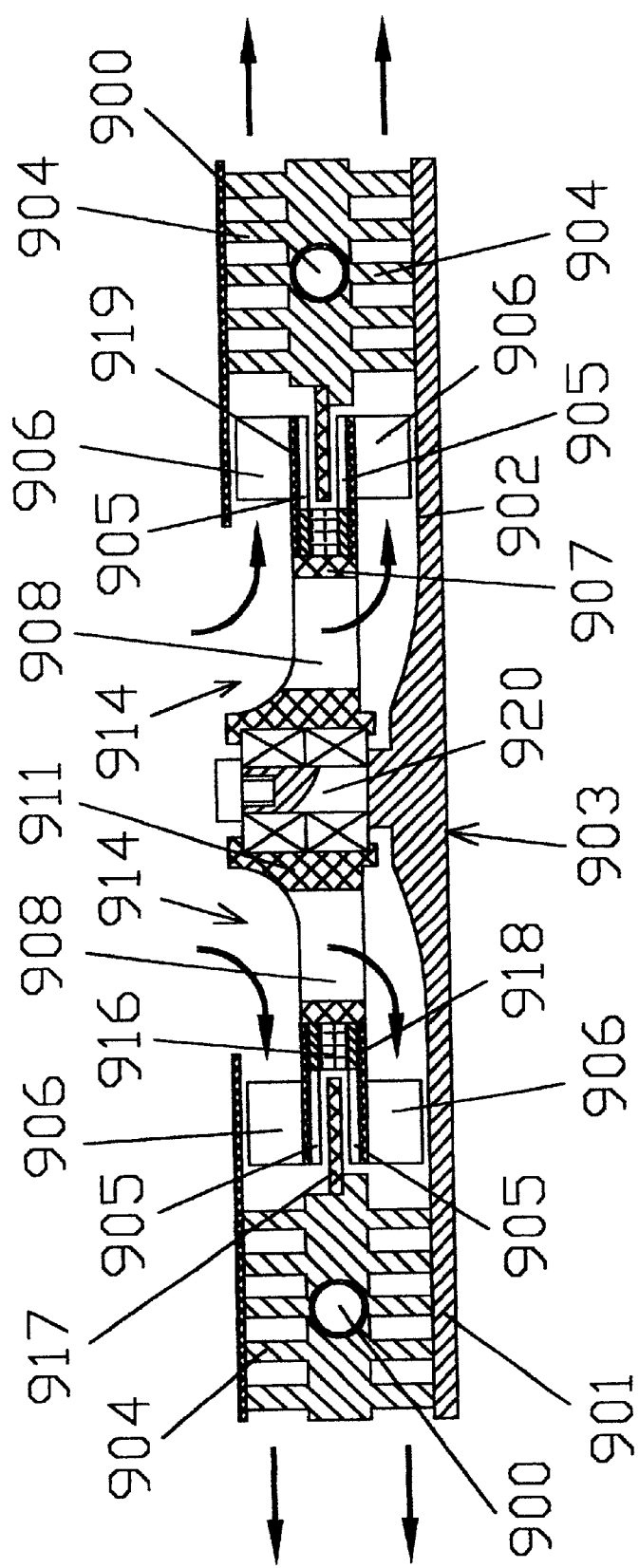
FIG. 31B is a side sectional view showing an option of the eight embodiment of the present invention with one electro drive and a flat heat pipe between two cooling devices and enter of the cooling gas from one side of the blower.

FIGS. 31A and 31B represents a modification of the eight embodiment of the present invention. The cooler for electronic devices in this modification comprises a heat exchange element 901 having a first 902 and a second 903 surfaces, a blower with a radial type impeller, a heat-radiating means that in this embodiment is a heat pipe 900 and an electric drive. The heat exchange element 901 has heat-exchanging means that in this embodiment are pins and/or fins 904 and made on the first surface 902 of said heat exchange element 901. The radial type impeller in this embodiment is and comprises at least two shroud 905, each of said at least two shroud 905 has a flat surface from one side, work elements-blades 906 from another side, a hub 911, and a central inlet 914 between the blades 906 and the hub 911, said shrouds 905 connected with the hub 911. The exit from the radial type impeller is surrounded by said heat exchanging means 904 and a cooling gas flows from the central inlet 914 through the blades 906 of the radial type impeller and the heat exchanging means 904 in a series way. On FIG. 31A the inlets 914 are from two sides of the heat exchange element 901, and a wall 907 that connected two shrouds 905 with the hub 911 separates the inlets 914 from each other. On FIG. 31B the inlets 914 are from one upper side of the heat exchange element 901, and the wall 907 that connected two shrouds 905 with the hub 911 has windows 908. The electric drive comprises a magnetic rotor 916 and a stator 917. The magnetic rotor 916 comprises at least two magnetized rings 918 and 919 having circumferential arrayed like poles and being mounted perpendicularly to the axis of rotation, and said circumferential arrayed like poles of one of the magnetized ring are magnetized in opposite polarity to the circumferential arrayed like poles of another magnetized ring in a projection at a plane normal to the axis of rotation, said at least two flat rings installed with a gap between said flat rings in a place, where the magnetic rotor 916 interact with the stator 917 and with a contact between said flat ring axially beyond the gap. Said stator 917 comprises circumferential arrayed coils, axis of said coils are parallel to the axis of rotation, said coils at least partially mounted at the gap between the circumferential arrayed like poles of one of the magnetized ring and the like circumferential arrayed poles of the another adjacent magnetized ring. The electric drive in this modification is substantially the same as in the first embodiment of the present invention and full description thereof of the electric drive is omitted. Every one of the flat rings of the magnetic rotor is placed on the flat surface of everyone of the two shrouds 905 of the radial type impeller and connects with them. A shaft 920 of the electric drive is located inside the hub 911 of the radial type impeller. The Stator 917 is located on a flat plate, said flat plate connects with the heat exchanging means 904, and the heat pipes 900 are located between the heat exchanging means 904.

The present invention comprises a combination of new flat type electric drive with hole in the central part with the blower with radial type impeller may be used for the purpose of cooling electronic devices (primarily—semiconductor devices), microcircuit chips and microprocessors.

Thus, according to seventh embodiment the limitation "radial type impeller" means any type impeller, which was described above in the previous embodiments, "heat exchanging means" may be any type pins, fins or heat exchanging channels which were described above in the previous embodiments.

As has been described above in detail, the present invention comprises combination of new flat type electric drive with hole in the central part with the blower with radial type impeller may be used for the purpose of cooling electronic devices (primarily—semiconductor devices), microcircuit chips and microprocessors.

Additional embodiments of the present invention will be apparent to those skilled in the art from consideration of the specification and practice of the present invention disclosed herein. It is intended that specification and examples be considered as exemplary only, with the true scope of the present invention being indicated by the following claims

What is claimed is:

1. A cooler for electronic devices comprising:
   (i) a heat exchange element having a first surface and a second surfaces, a blower with a radial type impeller, and an electric drive, wherein;
   (ii) said heat exchange element comprising heat exchanging means provided on the first surface of said heat exchange element while the second surface provides thermal contact with a heat-radiating means;
   (iii) said radial type impeller comprises a shroud with a flat surface on one side, a hub and brackets and a central inlet between the shroud and the hub, said brackets connect the hub with the shroud, said radial type impeller being positioned on the heat exchange element so that the heat exchanging means is surrounded by the radial type impeller and a cooling gas flows to the radial type impeller from the central inlet through the heat exchanging means;
   (iv) said electric drive comprising a magnetic rotor and a stator, said magnetic rotor being a substantially flat disk rotor comprising a central hole inside the substantially flat disk rotor and circumferential arrayed like poles, and said stator comprising circumferential arrayed coils whose axis are parallel to the axis of rotation, said coils mounted around the circumferential arrayed like poles, and wherein said magnetic rotor is placed on the shroud of the radial type impeller and connects with the shroud, the shaft of the electric drive is located inside the hub of the radial type impeller, and the central hole of the flat disk rotor is substantially coincided with the central inlet.

2. A cooler for electronic devices as claimed in claim 1, wherein said substantially flat disk rotor further comprises at least two magnetized flat rings having the central hole inside the rings and circumferential arrayed like poles and being mounted perpendicularly to the axis of rotation, and said circumferential arrayed like poles of a first one of the magnetized ring being magnetized in opposite polarity and coinciding with the circumferential arrayed like poles of a second one of the magnetized rings in a projection at a plane normal to the axis of rotation, wherein said at least two flat rings are installed with a gap between said flat rings in a place where the magnetic rotor interact with the stator, wherein a contact is provided between said flat ring axially beyond the gap, and wherein said coils of said stator are at least partially mounted at the gap between the circumferential arrayed like poles of the first one of the magnetized rings and the circumferential arrayed like poles of the second one of the magnetized rings.

3. A cooler for electronic devices as claimed in claim 2, further including a cylindrical magnet, said cylindrical magnet being magnetized in the axial direction and placed coaxially to the shaft between said magnetized rings.

4. A cooler for electronic devices as claimed in claim 2, wherein the flat rings are magnetized in a such way that the poles of each flat rings are like poles, while in relation to the poles of another flat rings they are unlike poles, and wherein the magnetic rotor poles comprise teeth on outer circumference of said flat rings, and said teeth coincide along a direction of said rotation axis.

5. A cooler for electronic devices as claimed in claim 1, wherein the heat exchanging means comprises pins and fins.

6. A cooler for electronic devices as claimed in claim 1, wherein the heat-radiating means comprises an electronic device.

7. A cooler for electronic devices as claimed in claim 1, wherein the heat-exchange element comprises a high heat-conducting material.

8. A cooler for electronic devices as claimed in claim 1, wherein the heat-radiating means comprises a heat-pipe.

9. A cooler for electronic devices as claimed in claim 1, wherein the brackets comprises axial blower blades.

10. A cooler for electronic devices as claimed in claim 1, wherein one of the flat rings of the magnetic rotor is flush-mounted with the flat surface of one side of the shroud of the radial type impeller.

11. A cooler for electronic devices as claimed in claim 1, wherein the radial type impeller comprises a drum type impeller.

12. A cooler for electronic devices as claimed in claim 1, wherein the radial type impeller comprises a disk-type impeller, said disk type impeller comprising at least one disk.

13. A cooler for electronic devices as claimed in claim 1, wherein the stator poles are placed in a space between said magnetic rotor poles.

14. A cooler for electronic devices comprising:
   (i) a heat exchange element having a first surface and a second surfaces, a blower with a radial type impeller and an electric drive, wherein:
   (ii) said heat exchange element comprises heat exchanging means and heat exchanging channels provided on the first surface of said heat exchange element while the second surface provides thermal contact with a heat-radiating means;

(iii) said radial type impeller comprises a shroud with a flat surface from one side, a hub, brackets, and a central inlet between the shroud and the hub, said brackets connect the hub with the shroud;

(iv) said heat exchanging means is surrounded by the radial type impeller, said radial type impeller is surrounded by said heat exchanging channels, and a cooling gas flows from the central inlet through the heat exchanging means, the radial type impeller and the heat exchanging channels in series;

(v) said electric drive comprises a magnetic rotor and a stator, said magnetic rotor comprising at least two magnetized flat rings having a hole inside said rings and circumferential arrayed like poles and being mounted perpendicularly to an axis of rotation, and said circumferential arrayed like poles of a first one of the magnetized rings being magnetized in opposite polarity and coinciding with the circumferential arrayed like poles of a second one of the rings in a projection at a plane normal to the axis of rotation, wherein said at least two flat rings are installed with a gap between said flat rings in a place where the magnetic rotor interact with the stator, wherein a contact is provided between said flat ring axially beyond the gap, wherein said stator comprises circumferential arrayed coils whose axes are parallel to the axis of rotation, said coils being at least partially mounted at the gap between the circumferential arrayed like pole of the first one of the magnetized rings and the circumferential arrayed like poles of the second one of the magnetized rings, and wherein one of the flat rings of said magnetic rotor is placed on the shroud of the radial type impeller, a shaft of the electric drive is located inside the hub of the radial type impeller, and the hole inside the rings substantially coincides with the central inlet.

15. A cooler for electronic devices as claimed in claim 14, wherein the heat exchanging means comprises at least one of pins and fins.

16. A cooler for electronic devices as claimed in claim 14, wherein the heat exchanging channels comprises rows of profiled elements.

17. A cooler for electronic devices as claimed in claim 16, wherein said profiled elements comprise at least one of pins and fins.

18. A cooler for electronic devices as claimed in claim 14, wherein the heat exchanging channels are spiral-like and bent in a direction of blower rotation.

19. A cooler for electronic devices as claimed in claim 14, wherein inlets of the heat exchanging channels are oriented in a direction of propagation of an output of the cooling gas flow produced by the radial type impeller.

20. A cooler for electronic devices as claimed in claim 14, wherein the heat exchanging channels have a constant width.

21. A cooler for electronic devices as claimed in claim 14, wherein the heat radiating means comprises an electronic device.

22. A cooler for electronic devices as claimed in claim 14, wherein the heat exchanging means comprises a high heat-conducting material.

23. A cooler for electronic devices as claimed in claim 14, wherein the heat radiating means comprises a heat-pipe.

24. A cooler for electronic devices as claimed in claim 14, wherein the brackets comprises axial blower blades.

25. A cooler for electronic devices as claimed in claim 14, wherein one of the flat rings of the magnetic rotor is flush-mounted with a flat surface of one side of the shroud of the radial type impeller.

26. A cooler for electronic devices as claimed in claim 14, wherein the flat rings are magnetized in a such way that the poles of each flat rings are like poles, while in relation to the poles of another flat ring they are unlike poles, and wherein the magnetic rotor poles comprises teeth on outer circumferences of said flat rings.

27. A cooler for electronic devices as claimed in claim 14, further including a cylindrical magnet, said cylindrical magnet being magnetized in an axial direction and placed coaxially to the shaft between said magnetized rings.

28. A cooler for electronic devices as claimed in claim 14, wherein the radial type impeller comprises a drum type impeller.

29. A cooler for electronic devices as claimed in claim 14, wherein the radial type impeller comprises a disk type impeller, and said disk type impeller comprises at least one disk.

30. A cooler for electronic devices as claimed in claim 14, wherein the stator comprises a printed circuit board, and said printed circuit board covers the heat exchanging channels from an opposite side of the second surface which provides thermal contact with the heat-radiating means.

31. A cooler for electronic devices as claimed in claim 14, wherein the stator poles are placed in the space between the said magnetic rotor poles.

32. A cooler for electronic device comprising:

(i) at least two heat exchange elements, each of said heat exchange elements having a first surface and a second surface, a blower with a radial type impeller, a heat radiating means and an electric drive, wherein:

(ii) said heat exchange element comprises heat exchanging means provided on the first surface of each of said heat exchange elements while the second surface of each heat exchange element provides thermal contact with the heat-radiating means;

(iii) said radial type impeller comprises two shrouds, each of said shrouds having a flat surface on one side, a hub and a central inlet between the shroud and the hub, and wherein said radial type impeller is positioned on the heat exchange element so that a cooling gas flows from the central inlet through the radial type impeller and the heat exchanging means in series;

(iv) said electric drive comprises a magnetic rotor and a stator, said magnetic rotor being a substantially flat disk rotor comprising circumferential arrayed like poles, and said stator comprising circumferential arrayed coils whose axes are parallel to an axis of rotation, said coils being mounted around the circumferential arrayed like poles, wherein said magnetic rotor is placed on the shrouds of the radial type impeller and connects with the shrouds, the shaft of the electric drive is located inside the hub of the radial type impeller, and said substantially flat disk rotor further comprises at least two magnetized flat rings having circumferential arrayed like poles and being mounted perpendicularly to the axis of rotation, said circumferential arrayed like poles of a first one of the magnetized rings being magnetized in opposite polarity and coinciding with the circumferential arrayed like poles of a second one of the magnetized rings in a projection at a plane normal to the axis of rotation, wherein said at least two flat rings are installed with a gap between said flat rings in a place where the magnetic rotor interacts with the stator, wherein a contact is provided between said flat ring axially beyond the gap, and said coils of said stator are at least partially mounted at the gap between the circumferential arrayed like poles of the first one of the magnetized rings and the circumferential arrayed like poles of the second one of the magnetized rings, and wherein said heat radiating means comprises at least one heat pipe that is in contact with two second surfaces of said at least two heat exchange elements.

33. A cooler for electronic devices comprising:

(i) a heat exchange element having a first surface and a second surface, a blower with a radial type impeller, a heat radiating means and an electric drive, wherein:

(ii) said heat exchange element comprises heat exchanging means provided on the first surface of said heat exchange element;

(iii) said radial type impeller comprises at least two shrouds, each of said at least two shrouds having a flat surface on one side, work elements on another side, a hub, and a central inlet between the work elements and the hub, said shroud being connected with the hub, and wherein said radial type impeller is surrounded by said heat exchanging means and a cooling gas flows from the central inlet through the radial type impeller and the heat exchanging means in series;

(iv) said electric drive comprises a magnetic rotor and a stator, said magnetic rotor comprising at least two magnetized flat rings having circumferential arrayed like poles and being mounted perpendicularly to an axis of rotation, said circumferential arrayed like poles of a first one of the magnetized rings being magnetized in opposite polarity to the circumferential arrayed like poles of a second one of the magnetized rings in a projection at a plane normal to the axis of rotation, wherein said at least two flat rings being installed with gap between said flat rings in a place where the magnetic rotor interacts with the stator, wherein a contact is provided between said flat ring axially beyond the gap, and said stator comprises circumferential arrayed coils being at least partially to the axis of rotation, said coils being at least partially mounted at the gap between the circumferential arrayed like poles of a first one of the magnetized rings and the circumferential arrayed like poles of a second one of the magnetized rings, wherein each of the flat rings of said magnetic rotor is place on the flat surface of each of the at least two shrouds of the radial type impeller and connects with them, and a shaft of the electric drive is located inside the hub of the radial type impeller, and wherein said stator is located on a flat plate that connects with the heat exchanging means, and the heat-radiating means is located between the heat exchanging means.

* * * * *